(12) United States Patent
Meghdadi et al.

(10) Patent No.: US 6,216,100 B1
(45) Date of Patent: Apr. 10, 2001

(54) METHOD FOR THE SIMULATION OF A NONLINEAR AMPLIFIER WITH ENVELOPE MEMORY EFFECT

(75) Inventors: Vahid Meghdadi; Jean-Pierre Cances, both of Limoges; François-René Chevallier, Antony; Jean-Michel Dumas, Limoges, all of (FR)

(73) Assignee: France Telecom SA, Paris (FR)

( * ) Notice: Subject to any disclaimer, the term of this patent is extended or adjusted under 35 U.S.C. 154(b) by 0 days.

(21) Appl. No.: 09/124,430

(22) Filed: Jul. 29, 1998

(30) Foreign Application Priority Data

Aug. 1, 1997 (FR) .................................................. 97 10052

(51) Int. Cl.$^7$ .............................. G06F 17/50; G06G 7/48; G06G 7/56
(52) U.S. Cl. .................................... 703/15; 703/4; 703/5; 703/14
(58) Field of Search ........................ 395/500, 36; 703/14, 703/15, 4, 5

(56) References Cited

U.S. PATENT DOCUMENTS 5,579,342    11/1996    Crozier ................................. 375/296

OTHER PUBLICATIONS

Bosch et al., Measurement and Simulation of Memory Effects in Predistortion Linearizers, IEEE Transactions on Microwave Theory and Techniques, vol. 37, No. 12; Dec. 1989, pp. 1885–1890.

Karam et al., Improved Data Predistortion Using Intersymbol Interpolation, World Prosperity Through Communications, Jun. 1989, vol. 1, pp. 286–291.

Poza et al., A Wideband Data Link Computer Simulation Model, NAECON '75 Record, pp. 71–78.

Saleh, Frequency–Independent and Frequency–Dependent Nonlinear Models of TWTA Amplifiers, IEEE Transactions on Communication, vol. Com–29, No. 11, pp. 1715–1720, Nov. 1981.

Abuelma'atti, Frequency–Dependent Nonlinear Quadrature Model for TWT Amplifiers, IEEE Transactions on Communication, vol. Com 32, No. 8, pp. 982–986, Aug. 1984.

Abuelma'atti, Input Power Assignment of Equal–Amplitude Multicarrier Systems for Given Output Carrier Power, Int. J. Electronics, 1981, vol. 50, No. 1, pp. 55–60.

*Primary Examiner*—Kevin J. Teska
*Assistant Examiner*—Hugh Jones
(74) *Attorney, Agent, or Firm*—Nilles & Nilles, s.c.

(57) ABSTRACT

A method for the simulation of responses of a nonlinear amplifier provides for measuring characteristics of nonlinearity of amplitude and of amplitude/phase-shift conversion of the amplifier, each measurement being made at an amplitude that is constant in input. The method further includes measuring the characteristics at different frequencies, developing the characteristics in sequences of direct transfer functions, computing frequency correctors for the direct transfer functions, measuring characteristics of distortion of amplitude modulation, each measurement being performed by modulating the input amplitude, computing modulation transfer functions reproducing the distortion amplitudes at output according to the input modulation amplitudes and correcting the direct transfer functions when the input amplitude is modulated in order to simulate the envelope memory effect. There is a direct application of the invention to the field of the simulation of high efficiency microwave amplification.

18 Claims, 12 Drawing Sheets

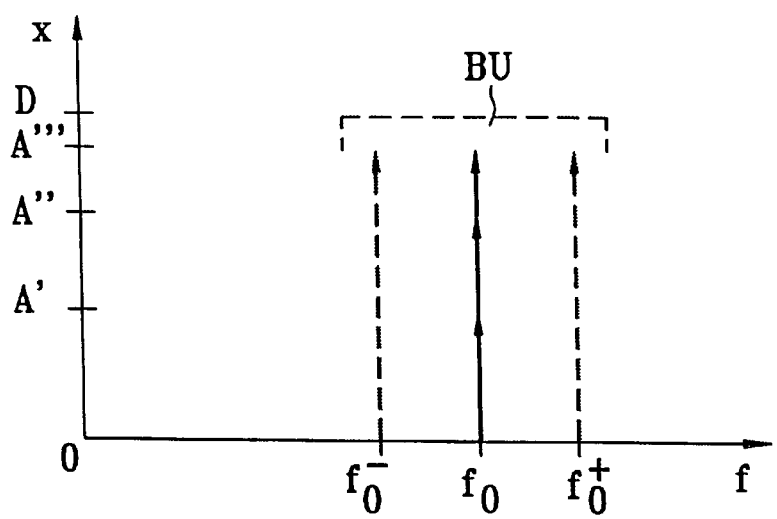
*FIG. 5*
(Prior Art)
*FIG. 6*
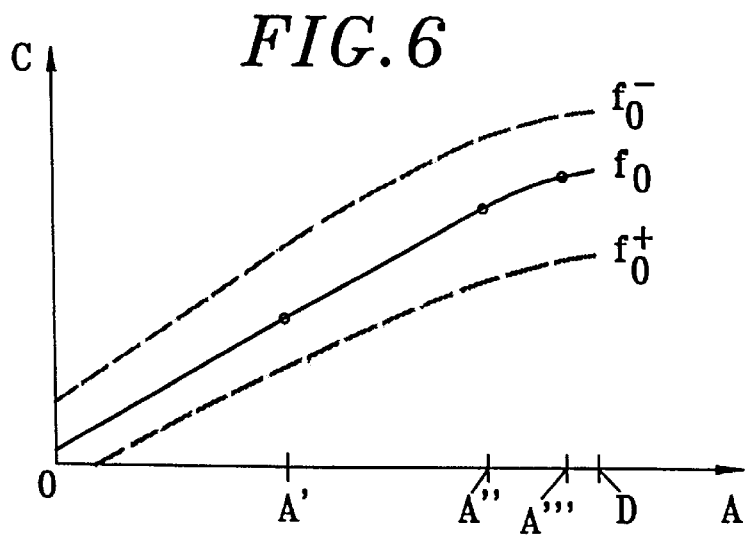
6A
(Prior Art)
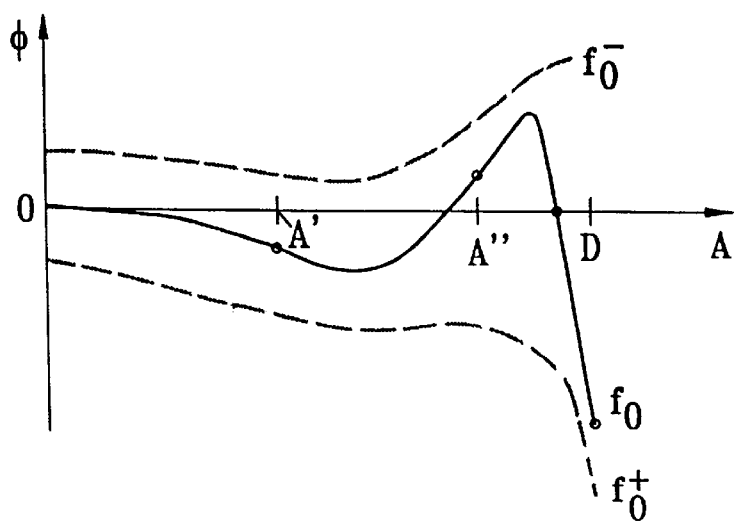
6B
(Prior Art)

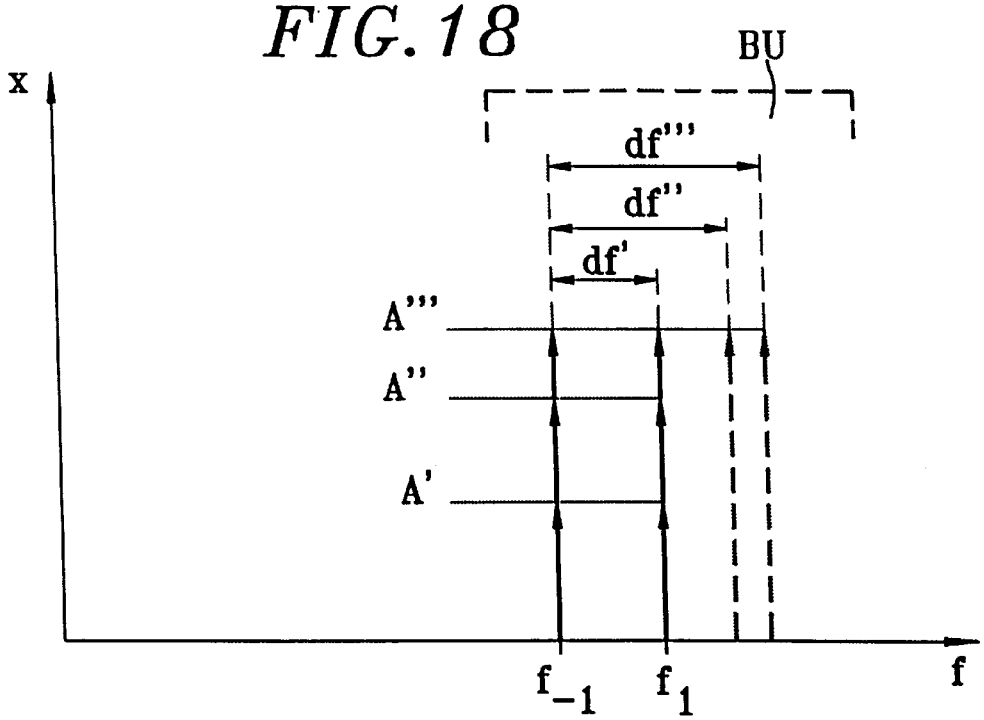
FIG. 18
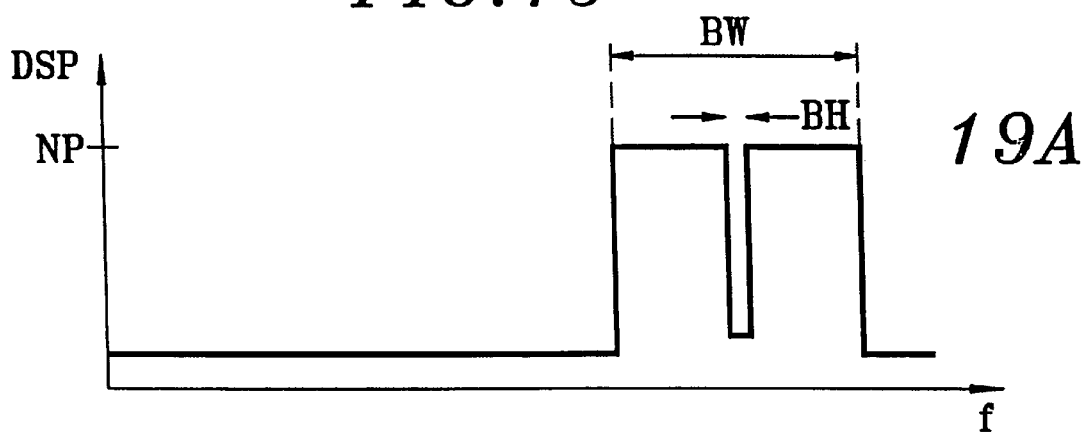
FIG. 19
19A
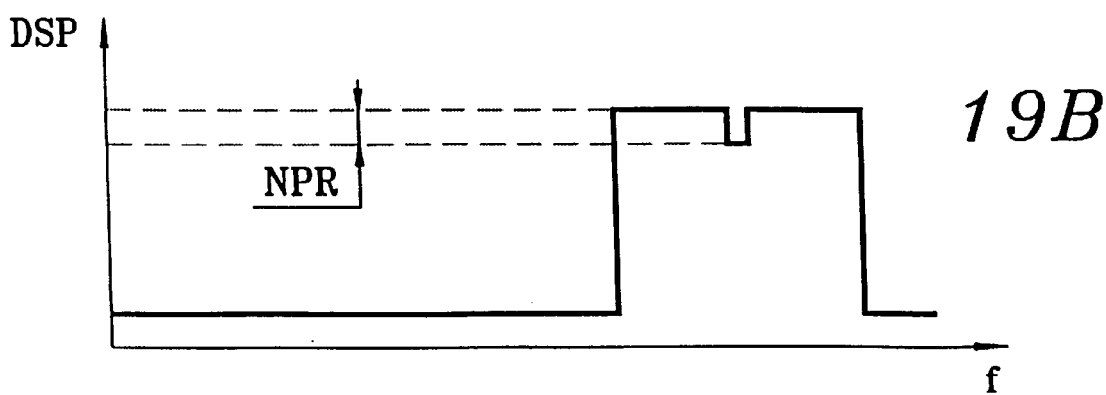
19B

METHOD FOR THE SIMULATION OF A NONLINEAR AMPLIFIER WITH ENVELOPE MEMORY EFFECT

BACKGROUND OF THE INVENTION

1. Field of the Invention

The present invention relates to the field of the simulation of signal responses of nonlinear amplifiers. An object of the invention is a system for the simulation of the response signal of a nonlinear amplifier having a memory effect.

A system of this kind can be applied to the simulation of high efficiency microwave amplification, especially in the AB, B or C class of amplification and more particularly to the simulation of the response of solid state power amplifiers (SSPA) and travelling wave tube amplifiers (TWT) used in land or satellite transmission radio links.

At high frequencies or at high efficiency, amplifier devices of this kind have a nonlinear characteristic response curve.

2. Description of the Prior Art

FIG. 1 illustrates an exemplary input/output response curve of a nonlinear amplifier ANL. The curve giving the output signal level g of the amplifier ANL as a function of the input signal level x is typically inflected at the high amplitudes A of the input signal x because of saturation phenomena. When the amplifier is used in conditions such that the gain is not constant as a function of the input signal level x, it is said to be an amplifier working in nonlinear mode or more simply the amplification is called nonlinear amplification.

Nonlinear devices can be divided into memoryless devices, quasi-memoryless devices and devices with memory.

Memoryless amplifiers have high nonlinearity in amplitude and a lower phase distortion. The input/output response characteristic of a memoryless nonlinear amplifier ANL can then be reduced, as shown in FIG. 1, to a single curve g(x).

It is possible to model and simulate the response, as a function of the time t, of an memoryless amplifier ANL to a sinusoidal input signal x, with a frequency $f_0$, that is amplitude modulated A and phase modulated $\phi$, the signal having the following form:

$$x(t)=A(t).\cos(2.f_0.t+\phi(t)) \quad (1)$$

A(t) represents the envelope of the input signal, which is defined by the amplitude limits in which the sine signal x evolves, the envelope varying as a function of time. FIG. 3 illustrates a timing diagram of a signal x(t) having a constant envelope A.

The output signal g of the memoryless amplifier then has the following form:

$$g(t)=C(A(t)).\cos(2\pi.f_0.t+\phi(t)) \quad (2)$$

It is useful to give a complex envelope to these signals x and g in abandoning any reference to the time t since the memoryless amplifiers have an instantaneous response.

The input signal x of the equation (1) has a complex envelope X with the following form:

$$X=A.\exp(j.\phi) \quad (3)$$

All the useful information pertaining to the amplitude modulation A(t) and phase modulation $\phi(t)$ is recorded in this complex envelope X.

The output signal g of equation (2) similarly has a complex envelope G with the following form:

$$G=C(A).\exp(j.\phi) \quad (4)$$

For a memoryless nonlinear amplifier ANL, it is shown that C(A) is the Chebyshev transform of the input/output response curve g(x).

The response of a :memoryless nonlinear amplifier ANL to a modulated signal x can therefore be modeled and simulated simply by a single curve C(A), whose example is shown in an unbroken line in FIG. 6A. A curve of this kind giving the output amplitude C as a function of the input amplitude A is called a curve of nonlinearity in amplitude and is referenced in abbreviated form as an AM/AM curve.

FIG. 2 illustrates a response characteristic of a nonlinear amplifier with memory ANLAM on which there appears a phenomenon of hysteresis prompted by a memorizing effect. It can be seen that the rising hysteresis curves m and m' are not superimposed on each other when the respective amplitudes A and A' of the input signal x are different. The variation in memorizing time related to the variation in amplitude prevents the curves m and m' from getting superimposed on each other.

When the memorizing time of the amplifier ANLAM is negligible in comparison to the period of the amplitude variation A(t), it can furthermore be considered that the amplitude A is stable and the amplifier is called a quasi-memoryless amplifier.

FIG. 4 shows a timing diagram of an output signal y of a quasi-memoryless amplifier to which there is applied the input signal x illustrated by the timing diagram of FIG. 3 whose formula is recalled here below:

$$x(t)=A(t).\cos(2\pi.f_0.t+\phi(t)) \quad (1)$$

For a quasi-memoryless nonlinear amplifier to which the signal x of equation (1) is applied, the output signal y takes the following form:

$$y(t)=C(A).\cos(2\pi.f_0.t-\Phi(A)+\phi(t)) \quad (5)$$

where C(A) is the amplitude of the output signal y, and $\Phi(A)$ is the phase shift of the output signal y, which depends on the amplitude A(t) of the input signal x.

Thus, at a given instant t, the amplitude C(A) and the phase shift $\Phi(A)$ of the output signal y depend solely on the amplitude A of the input signal x at this instant t. It is thus possible to overlook the amplitude variations A(t) as a function of time and consider that the amplitude A is almost constant as can be seen in FIG. 3.

It is also useful to write in a complex form the envelopes of the signals x and y expressed here above, namely as the envelopes X and Y which take the following respective forms:

$$X=A.\exp(j.\phi) \quad (3)$$

(the envelope A considered as being constant in time)

$$Y=C(A).\exp(j.\phi-\Phi(A)) \quad (6)$$

The response of a quasi-memoryless nonlinear amplifier can therefore be modeled and simulated simply on the basis of knowledge of the following two characteristic curves:

1. A curve C(A) wherein the amplitude C of the output signal y is a function of the amplitude A of the input signal, illustrated for example by the curve AM/AM, in an unbroken line, of FIG. 6A (amplitude/amplitude conversion curve);

2. A curve Φ(A) wherein the phase shift Φ of the output signal y with respect to the input signal x is a function of the amplitude A of the signal x, called an amplitude/phase conversion curve, abbreviated as AM/PM, an example of which is shown in an unbroken line in FIG. 6B.

It can be shown that, similarly, the curve C(A) is the norm of the complex Chebyshev transform of the response characteristic y(x), the curve Φ(A) being the argument of the complex transform.

The complex envelope Y of the output signal can also be written in the form of two parts, namely a real part and an imaginary part, corresponding to an in-phase component P and a quadrature component Q, these components P and Q having the following forms:

$$P(A)=C(A).\cos(\Phi(A)) \quad (7')$$

$$Q(A)=C(A).\sin(\Phi(A)) \quad (7'')$$

FIG. 7 shows an example of curves P(A) and Q(A) equivalent to the curves C(A) and Φ(A) of FIGS. 6A and 6B.

The known models of simulation of the response of quasi-memoryless amplifiers generally prefer to use characteristics in the form of pairs of curves P(A) and Q(A) rather than in the form of pairs of curves C(A) and Φ(A), although these pairs of curves are strictly equivalent.

According to a known principle of the simulation of nonlinear amplifiers, the amplifier that is made is precharacterized on the test bench. The precharacterizing is done with a signal having a specified frequency and amplitude in order to then simulate the response to a signal of any frequency and amplitude.

As shown schematically in FIG. 5, a signal with a single-frequency $f_0$ taking different amplitudes A', A", A''' is applied to the amplifier tested to obtain its characteristics, illustrated for example in FIG. 6 or 7.

However, for amplifiers having a certain quantity of memory, it is observed that the characteristics vary to a major degree depending on the frequency $f_0^-$, $f_0$ or $f_0^+$ of the signal to be amplified.

A known system for the simulation of such amplifiers has been explained by H. B. Poza in an article entitled "A Wideband Data Link Computer Simulation Model", in the "NAECON'75 Record", page 71. The article proposes plotting of several pairs of curves AM/AM and AM/PM for several frequencies $f_0^-$, $f_0$ or $f_0^+$ of operation of the amplifier. FIGS. 6A and 6B thus show an example of three pairs of curves AM/AM and AM/PM obtained respectively at three frequencies $f_0^-$, $f_0$ and $f_0^+$ located in the useful band BU of a directional radio link amplifier.

H. B. Poza's simulator stores only one pair of curves AM/AM and AM/PM, for example the pair of curves obtained at the frequency $f_0$, and reconstitutes the other pairs of curves (not stored) corresponding to the other frequencies $f_0^-$, $f_0^+$ or to intermediate frequencies. A non-stored curve is deduced simply by translating the stored curve by an appropriate vector. The simulator computes the components along the axis (A) and along the axis (C) or (φ) of the translation vector to bring the curve for the frequency $f_0$; shown in an unbroken line in FIG. 6A or 6B, as close as possible to the frequencies $f_0^-$ or $f_0^+$, shown in dashed lines.

A simulation system of this kind gives too much of an approximation to simulate the distortions that appear on a quasi-memoryless amplifier at different frequencies.

Another drawback of a system of this kind is that it cannot be used to simulate the response of an amplifier with memory.

FIG. 9 illustrates another known system of simulation according to the model of A. A. M. Saleh, described in an article "Frequency-Independent and Frequency-Dependent Models of TWTA Amplifiers" November 1982, in "IEEE Transactions on Communication", Volume Com-29, No. 11, page 1715. The computation of the response to an input signal x of a quasi-memoryless nonlinear amplifier can be subdivided into two steps P(A,f) and Q(A,f) for the computation of two respective components yp and yq of the output signal y. The component yp is in phase with the input signal x while the component yq is in quadrature.

Saleh's stimulation system uses results for the characterization of the amplifier at several frequencies f, several pairs of curves P(A) and Q(A) being plotted at several frequencies f to compute transfer functions P(A,F) and Q(A,f) corresponding to each arm for the computation of the components yp and yq of the output signal y. Each of the transfer functions P(A,f) or Q(A,f) corresponds to the computation of a nonlinear response without memory effect, since no phase shift is introduced into each of these computation branches.

A. A. M. Saleh's article points out that the model can be applied to the amplification of single-frequency signals and, by conjecture, assumes that it will be applicable to the simulation of signals of any form.

Another drawback of this model is that it cannot be applied to amplifiers with memory, as the system does not realize distortions appearing at different frequencies when the amplitude of the signal varies at high speed with respect to the memorizing time constants.

For nonlinear amplifiers with memory ANLAM, the memorizing effects are greater, as the memorizing time is not negligible in comparison with the time of variation of the amplitude A(t). In such cases, a more complex method such as that of nonlinear differential equations or the development of the characteristic curves in sequences of functions is necessary to simulate the response of the amplifier with memory ANLAM.

An improved known model is proposed by M. T. Abuelma'atti in an article entitled "Frequency-Dependent Nonlinear Quadrature Model for TWT Amplifiers", in August 1984, in the journal IEEE Transactions on Communication, Volume Com. 32, No. 8, page 982. The modeling uses a development of the characteristic curves of a nonlinear amplifier in sequences of Bessel functions making it possible to simulate the response of amplifiers with memory.

FIG. 10 illustrates the simulation system described by M. T. Abuelma'atti which, as here above, comprises two branches of computations of the in phase component yp and the quadrature component yq of the output signal y, each arm computing the contribution of a sequence of N Bessel functions J1 depending on the amplitude A of the input signal x, in weighing each function J1 by a coefficient α and a factor G(f) of correction in frequency. The coefficients $\alpha_n$ and the factors $G_n(f)$ are computed after having established several pairs of curves P(A) and Q(A) that are characteristic of the nonlinear amplifier, the curves being plotted at several testing frequencies f of the amplifier.

With FIG. 8, it can be seen that two weighted sums of N Bessel functions of the first kind of first order, referenced J1(nπA/D), enable the very precise interpolation of the curves P(A) and Q(A), like those of FIG. 7, by adjusting the weighting coefficients $\alpha_{np}$ and $\alpha_{nq}$ of these functions J1.

It can be noted that the Bessel functions are the Chebyshev transforms of sine functions and that the development, in sequences of Bessel functions, of the curves P(A) and Q(A) corresponds to a Fourier development, in sequences of sine functions, of the curves y(x) of nonlinearity of the amplifier, which is elegantly suited to the sinusoidal form of the hysteresis curves y(x) as shown in FIG. 2.

Theoretically, a system of this kind should enable the simulation of the amplification of multicarrier signals, namely signals comprising several sinusoidal components of distinct frequencies.

However, the nonlinear amplification of a multicarrier input signal is complicated by the appearance of distortions known as intermodulation phenomena. When a nonlinear amplifier receives several carrier frequencies at input, there are obtained at output, in addition to the amplified carriers, undesired harmonics known as intermodulation products, each harmonic having a frequency distinct from the frequencies of the carriers.

FIGS. 11–14 illustrate the appearance of the intermodulation phenomenon during the nonlinear amplification of a two-carrier signal.

FIG. 11 is a graph pertaining to the frequency of a two-carrier input signal x representing, for example, two carrier components with respective frequencies $f_{-1}$ and $f_1$ having an equal input amplitude A. The two carrier frequencies $f_{-1}$ and $f_1$, located in the useful frequency band BU of the amplifier are separated by a frequency difference df.

FIG. 14 is a graph pertaining to the frequency of an output signal y that corresponds to the amplification ANLAM with memory effect of the two-carrier input signal x of FIG. 11. It can be seen that the output signal y has a series of harmonics of various frequencies f and different amplitudes C.

The frequency of each of these intermodulation components is an integer combination of the carrier frequencies at input.

The detail of the output harmonics included in the useful band BU, illustrated in FIG. 14, is as follows:
1. The carriers, with respective frequencies $f_{-1}$ and $f_1$, and amplitudes $C_{-1}$ and $C_1$ at output; and
2. The third-order intermodulation components, with respective frequencies $f_{-3}$, $f_3$, and amplitudes $C_{-3}$, $C_3$ at output.

FIG. 15 reproduces results according to Abuelma'atti's model which has enabled an estimation of the amplitudes $C_{-1}$, $C_1$, and $C_{-3}$, $C_3$ of carrier components and third-order intermodulation components.

However, the estimation of the amplitude of the intermodulation components by Abuelma'atti's model corresponds poorly to the reality of the measurements of intermodulation distortions on nonlinear amplifiers in multicarrier operation with high efficiency.

Indeed, a general phenomenon known as an envelope memory effect arises when a multicarrier signal is amplified. For this type of signal, the envelope, which is defined by the positive and negative limits in amplitude of the signal, is not constant.

In this case, it can no longer be assumed that the envelope is constant as in the quasi-memoryless models. In fact, the memorizing time constants are no longer negligible with respect to the time of variation of the envelope.

FIG. 12, which illustrates the temporal progress of the two-carrier input signal x of FIG. 11 shows, for example, that the envelope X(t) and −X(t) of the two-carrier signal varies very swiftly and in major proportions whereas the amplitude A of each carrier $f_1$ and $f_{-1}$ is assumed to be constant.

FIG. 13 which illustrates the temporal progress of the output signal y corresponding to the preceding two-carrier input signal x, shows that the envelope Y(t) and −Y(t) of the output signal y is deformed by the intermodulation distortions. The appellation 'envelope memory effect' is used to designate such deformations of amplitude of the signal by a nonlinear amplifier with memory.

The known models do not take into account the two effects illustrated in FIGS. 16 and 17. In particular, FIG. 16 illustrates that the ratio C1/C3 (comparing the amplitude C1 of carriers with respect to the amplitude C3 of the intermodulation components) varies considerably depending on the frequency difference df of the carriers and depending on the precise value of the amplitude A of the carriers of the input signal.

Through the application of Abuelma'atti's model, the ratio C1/C3 does not depend on the frequency difference and varies continuously according to the input amplitude A.

The second observed effect is that the presence of a second carrier influences the output amplitude of the first carrier.

FIG. 17 shows, for example; output amplitude attenuation or resonance peaks C1 or C−1 of each of the carriers with frequencies $f_1$ or $f_{-1}$, depending on the frequency difference df between the two carriers (df being equal to $f_1 - f_{-1}$).

Therefore, the above-identified prior art models do not account for these effects. Moreover, in general, these models simply do not simulate any envelope memory effect.

SUMMARY OF THE INVENTION

It is therefore an object of this invention to provide for a precise simulation of the envelope memory effect on nonlinear amplifiers. It is a further object of this invention to provide a method and device enabling the very precise simulation of the response of a nonlinear amplifier to multicarrier signals.

It is yet a further object of this invention to provide a method and device for the simulation of nonlinear amplifiers with memory effect.

The invention achieves the foregoing objects by providing for a dynamic measurement of the characteristics of the amplifier under the conditions in which the distortions appear. According to the invention, the characteristics of distortion of amplitude modulation are measured by providing for the application of an amplitude-modulated signal, at each measurement, which allows the envelope of the signal to vary. The distortion characteristics make it possible to correct the simulated responses on the basis of characteristics plotted at constant amplitude. The characteristics are measured by applying a multicarrier signal which is therefore amplitude modulated.

In the preferred embodiment of the invention, a method for the simulation of signal responses of a nonlinear amplifier showing a memory effect, includes measuring characteristics of amplitude/amplitude conversion and amplitude/phase-shift conversion of the amplifier, wherein each measurement is made at an amplitude that is constant in input. The characteristics in sequences of direct transfer functions are developed and characteristics of distortion of amplitude modulation are measured, wherein each measurement is performed by modulating the input amplitude. Finally, the modulation transfer functions reproducing the distortion amplitudes are computed at output according to the input modulation amplitudes and the direct transfer functions are corrected when the input amplitude is modulated in order to simulate the envelope memory effect.

A measurement of characteristics of distortion of amplitude modulation consists of the measurement of the intermodulation distortions by the application at input of a signal comprising at least two carriers at different frequencies. In an alternate embodiment of the invention, characteristics of rejection of intermodulation components are measured at output, wherein each measurement is performed with a group of carriers at input having specified amplitudes.

Another alternative embodiment of the invention includes measuring characteristics of interaction of carriers at output, wherein each measurement is performed with a group of carriers at input having specified amplitudes.

Yet another alternative embodiment of the invention includes measuring output modulation noise characteristics, wherein each measurement is performed with specified input modulation amplitudes.

Another object of the invention provides a device for the simulation of signal responses of a nonlinear amplifier having a memory effect, wherein the device includes a module for the computation of the response of a nonlinear amplifier to a single-carrier signal. The module includes at least one filter having a transfer function prepared from real characteristics of the amplifier, including characteristics of nonlinearity of amplitude and amplitude/phase shift conversion, wherein the transfer function is corrected in frequency by a corrector computed on the basis of characteristics measured at different single-carrier signal frequencies. The device also includes means for the generation of harmonics in response to a multicarrier signal.

The harmonic generation means of the device preferably includes a module for the Fourier analysis of a signal into frequency components and/or a combinational module computing the combinations of frequency of intermodulation components and/or a normative module computing an r.m.s. value of signal amplitude.

In the preferred embodiment of the invention, a filter for the modulation of the response of the computation module includes a transfer function prepared from characteristics of rejection of intermodulation components when the amplification of a multicarrier signal is simulated by the device.

In an alternative embodiment of the invention, a filter for the correction of the response of the computation module includes a transfer function prepared from carrier interaction characteristics, so that the amplitude of a carrier given by the computation module is corrected by the correction filter when the amplification of a multicarrier signal is simulated by the device.

Other objects, features and advantages of the present invention will become apparent to those skilled in the art from the following detailed description and the accompanying drawings. It should be understood, however, that the detailed description and specific examples, while indicating preferred embodiments of the present invention, are given by way of illustration and not of limitation. Changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which:

FIG. 5 illustrates a schematic view of a frequency diagram of measurements of characteristics as is already known in the art;

FIG. 6A illustrates the response of a memoryless nonlinear amplifier ANL to a modulated signal x wherein the amplitude C of the output signal y is a function of the amplitude A of the input signal (the amplitude/amplitude conversion curve) as is already known in the art;

FIG. 6B illustrates the response of a memoryless nonlinear amplifier ANL to a modulated signal x wherein the phase shift $\Phi$ of the output signal y with respect to the input signal x is a function of the amplitude A of the signal x (the amplitude/phase conversion curve) as is already known in the art;

FIG. 18 illustrates a frequency graph showing measurements of characteristics implemented according to the present invention;

FIGS. 19A and 19B illustrate examples of power spectral density (DSP) of the signal used at input of the amplifier for the measurement of the noise power ratio NPR;

DETAILED DESCRIPTION OF THE PREFERRED EMBODIMENT

Figure 23:
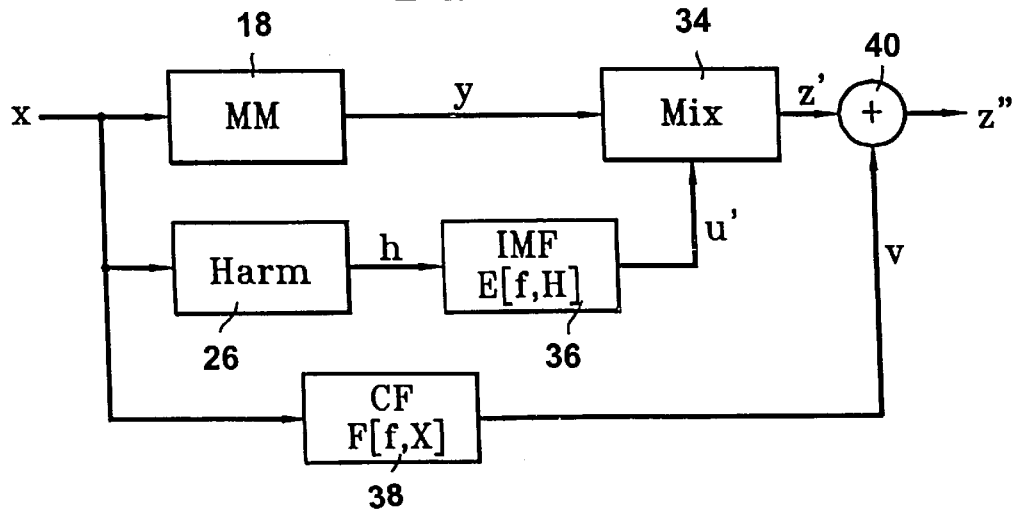
FIG. 23 illustrates a second alternative embodiment of a device for the simulation of nonlinear amplification with memory according to the present invention.
Figure 24:
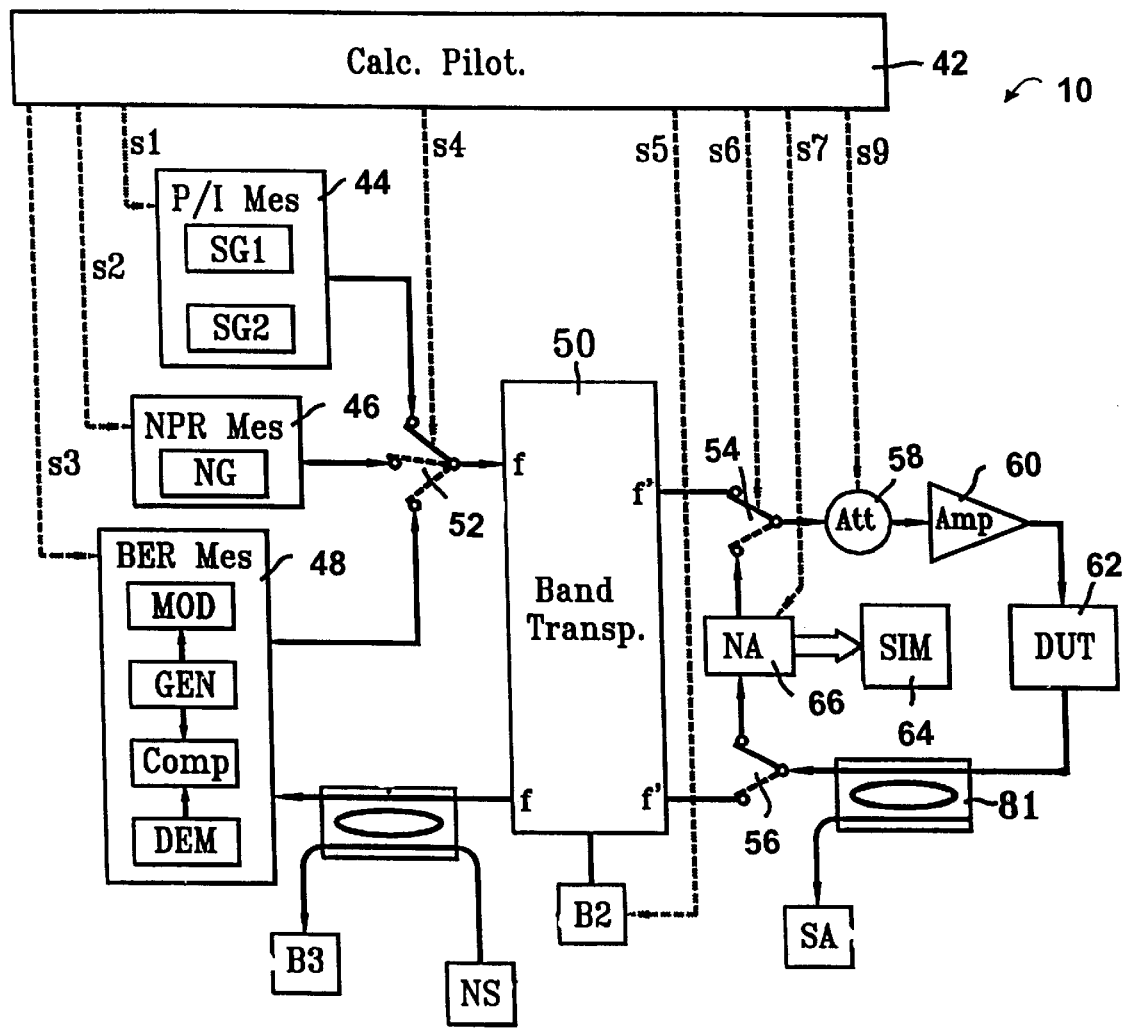
FIG. 24 illustrates a bench for the measurement of characteristics of intermodulation distortions according to the present invention.
Figure 25:
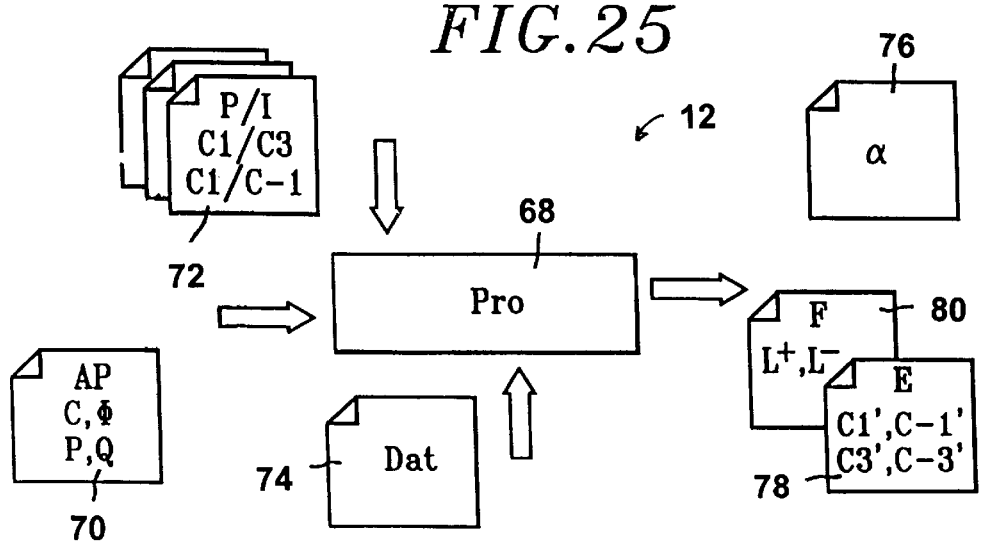
FIG. 25 illustrates a diagram of files of characteristics implemented by a method for the simulation of responses of a nonlinear amplifier according to the present invention.

Referring to the drawings, and more particularly to FIGS. 21–26, the first embodiments of the invention will be described. A simulation device 10 (FIG. 24) simulates the amplification of signals of any form including signals comprising several frequency components. In this regard, device 10 includes computation means 12 configured to simulate the response of a nonlinear amplifier (FIG. 25). Computation means 12 implements the process steps iterated in FIG. 26. Device 10 further includes means for the generation of harmonics in response to a multicarrier signal.

Figure 21:
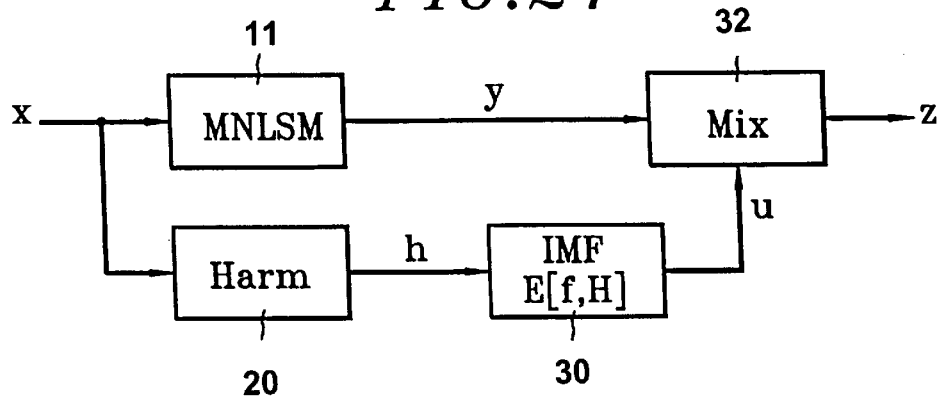
FIG. 21 illustrates a first embodiment of a device for the simulation of nonlinear amplification with memory according to the present invention.
Figure 22:
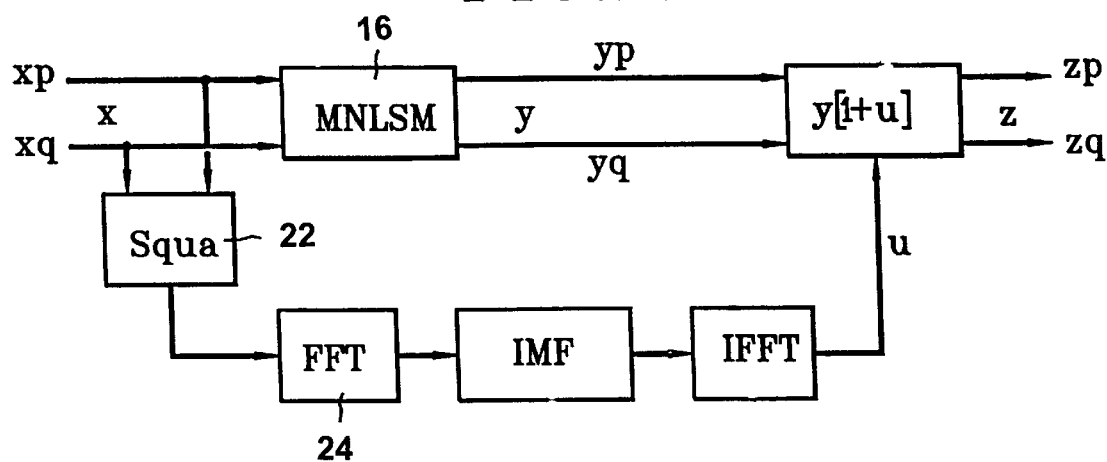
FIG. 22 illustrates a first alternative embodiment of a device for the simulation of nonlinear amplification with memory according to the present invention.

Referring to FIGS. 21–23, device 10 according to the invention includes an output signal computation block 14, 16, 18 that computes an output signal y and a frequency computation block 20, 22, 24, 26 for the generation of harmonics that computes the frequencies of the intermodulation components before the computation of their precise amplitude to correct the output signal y. Output signal computation blocks 14, 16 and 18 implement a known simulation model such as the memoryless nonlinear model MNLSM by H. B. Poza (FIG. 21), the memoryless quadratic nonlinear model MNLSM by A. A. M. Saleh (FIG. 22) and the model with memory MM by M. T. Abuelma'atti (FIG. 23). Other models can be implemented, and the description of the implementation of the invention will be developed essentially on the basis of the improved model by M. T. Abuelma'atti.

The parallel structure of output computation blocks 14 and 16 (MNLSM) or 18 (MM) and of harmonics generation blocks 20, 26 (Harm) or 22 (Squa) and 24 (FFT) is given by way of example. The structure of the blocks could be serial, and the effective making of the computation blocks could be done, by preference, by computer programs, wherein the blocks provide a schematic representation of the functions of computation subprograms.

Figure 1:
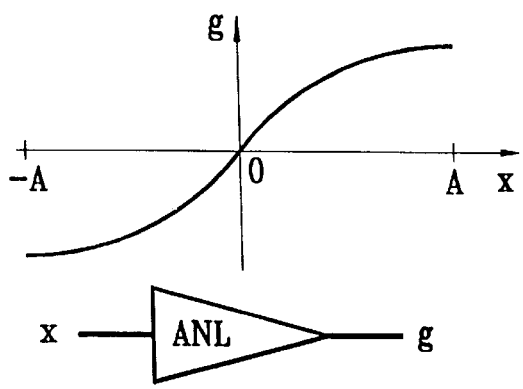
FIG. 1 illustrates an exemplary input/output response curve of a nonlinear amplifier ANL.
Figure 2:
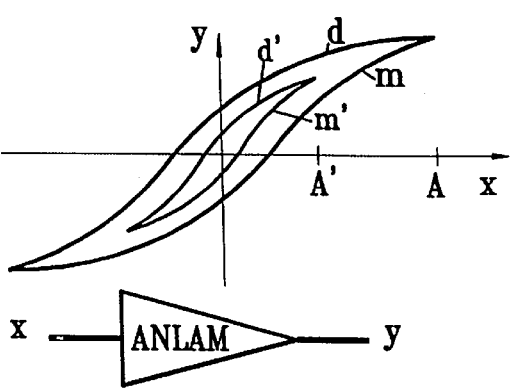
FIG. 2 illustrates a response characteristic of a nonlinear amplifier with memory ANLM.
Figure 3:
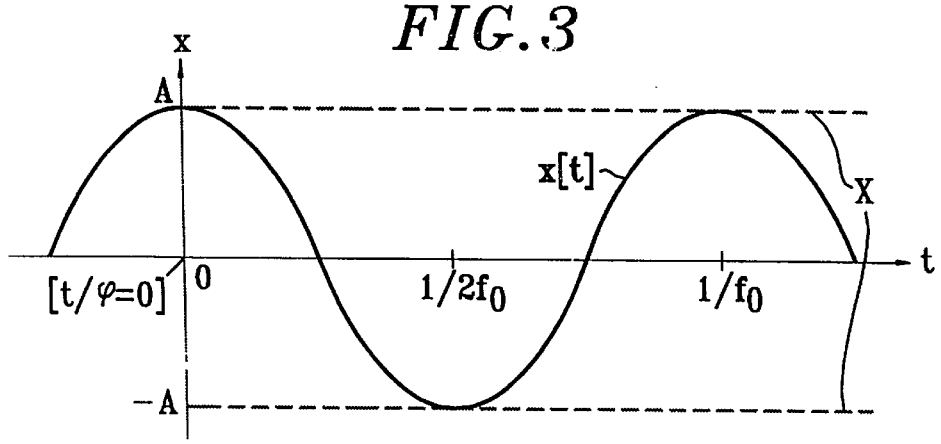
FIG. 3 illustrates a timing diagram of a signal x(t) having a constant envelope A.
Figure 4:
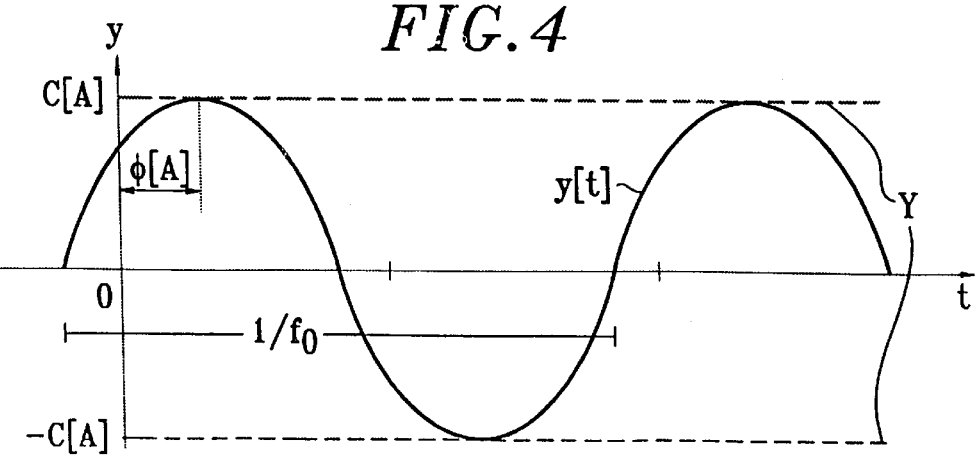
FIG. 4 illustrates a timing diagram of an output signal y of a quasi-memoryless amplifier.
Figure 7:
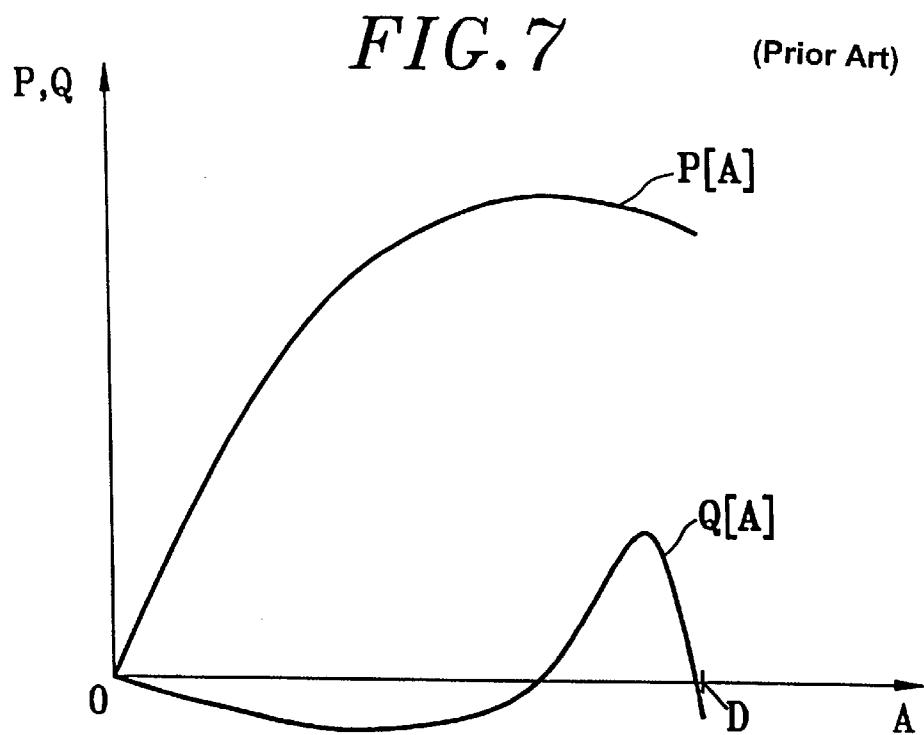
FIG. 7 illustrates curves of nonlinearity in phase P(A) and in quadrature Q(A) that are calculated by methods known in the art.
Figure 8:
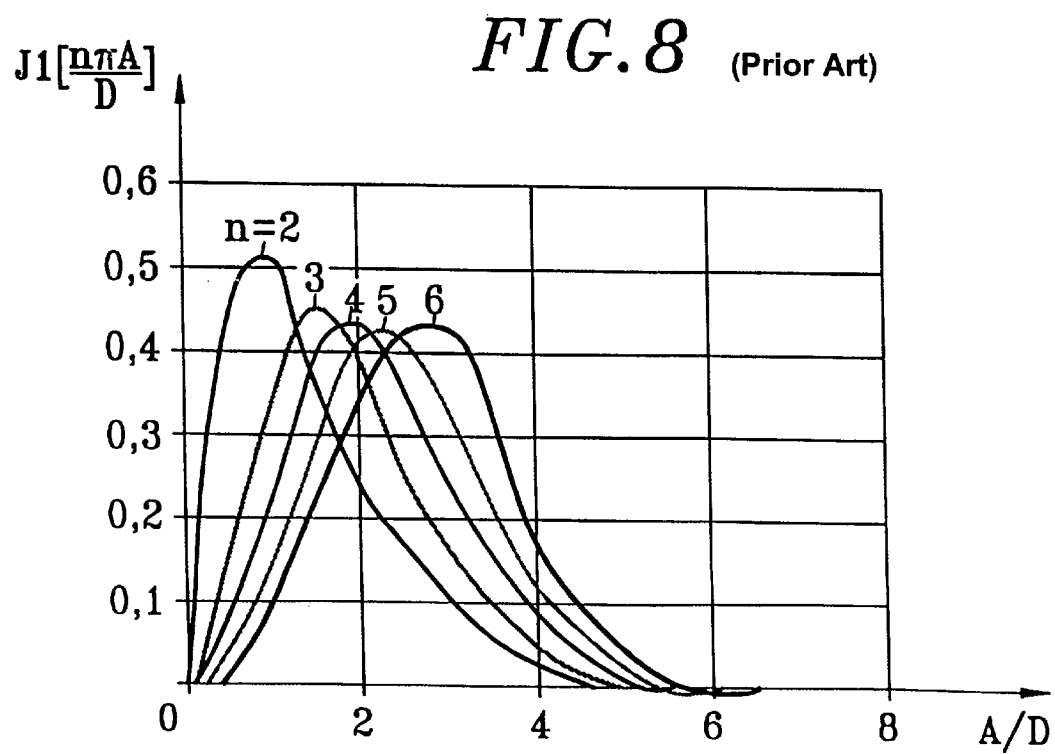
FIG. 8 illustrates a sequence of Bessel functions for the interpolation of curves P(A) and Q(A) by adjusting the weighting coefficients $\alpha_{np}$ and $\alpha_{nq}$ of functions J1 as is known in the art.
Figure 9:
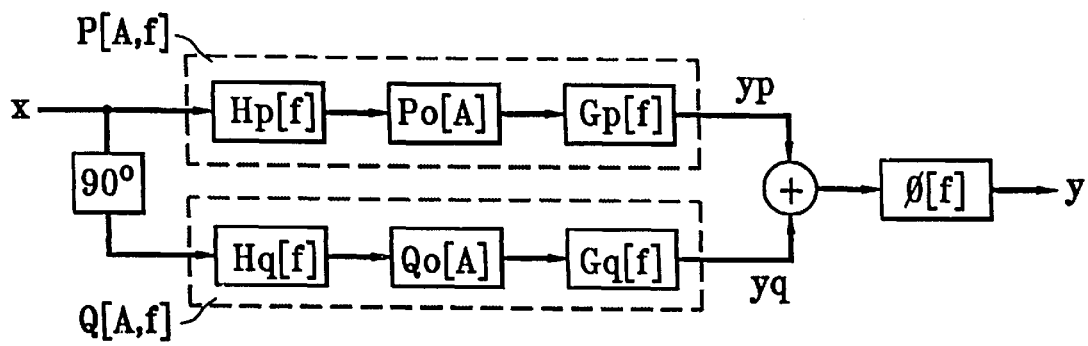
FIG. 9 illustrates a system of simulation based on the A. A. M. Saleh model that is known in the art.
Figure 10:
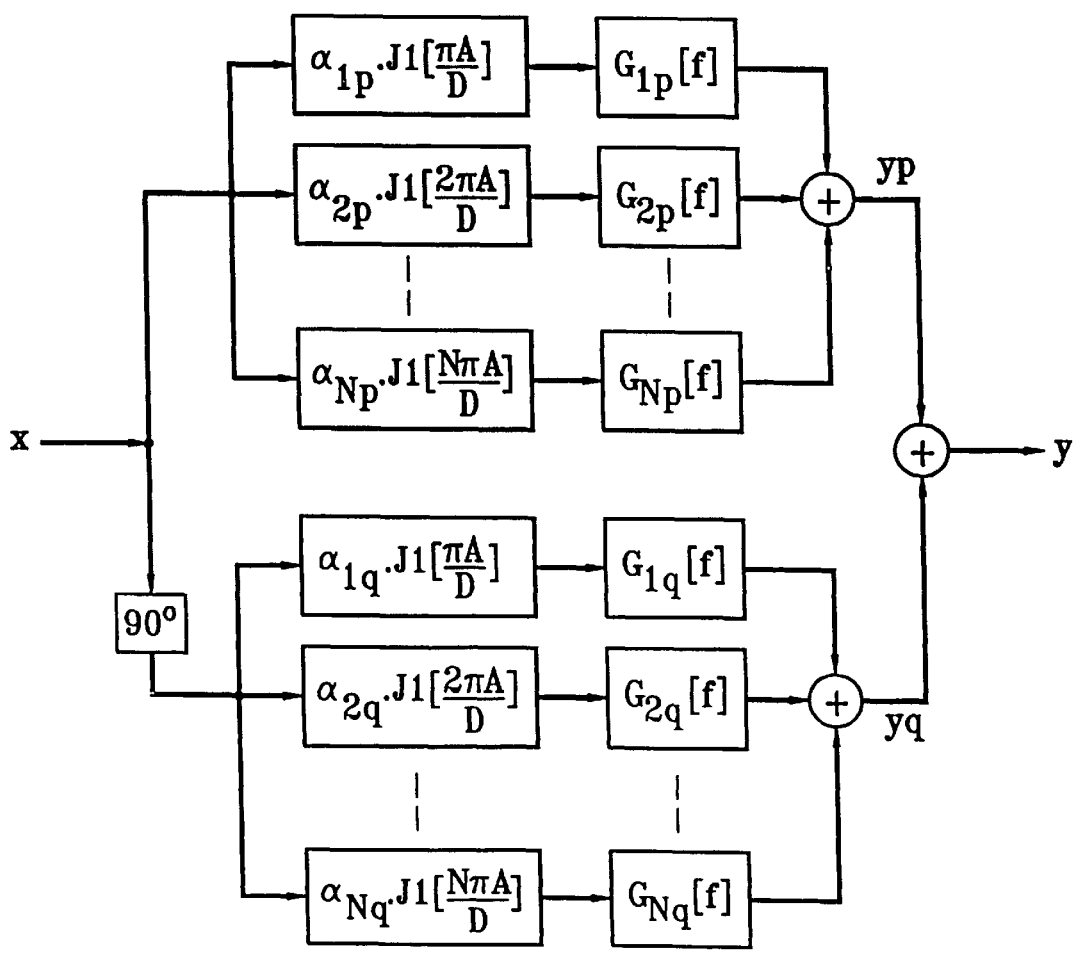
FIG. 10 illustrates a system of simulation based on the M. T. Abuelma'atti model that is known in the art.
Figure 11:
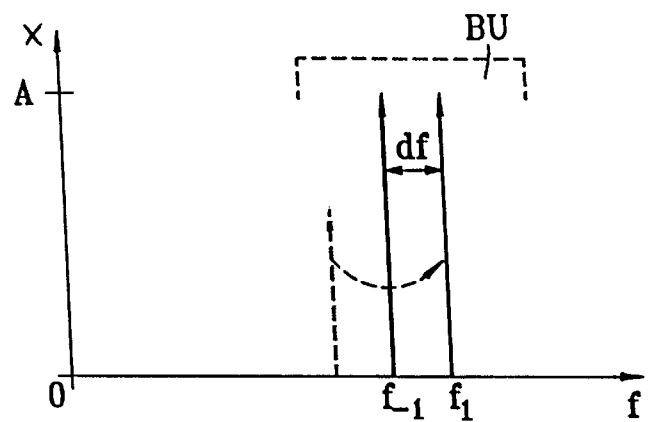
FIG. 11 illustrates the appearance of intermodulation during the nonlinear amplification of a two-carrier signal wherein input signal x represents two carrier components with respective frequencies $F_{-1}$ and $F_1$ having an equal input amplitude A.

FIG. 23 provides a detailed view of an alternative embodiment of harmonics generation for the computation of the improved intermodulation components on the basis of the Abuelma'atti model shown in FIG. 10. Blocks 26 (Harm) and 18 (MM) enable the computation of the amplitudes of intermodulation components . . . , $Y_{010}$, $Y_{1\text{-}11}$, $Y_{-120}$, $Y_{-111}$, $Y_{0\text{-}12}$, $Y_{-102}$, $Y_{20\text{-}1}$, $Y_{2\text{-}10}$, $Y_{11\text{-}1}$, $Y_{02\text{-}1}$, . . . when the input signal x comprises a multitude of frequency components A, B, . . . , M. This complex structure of blocks 26 (Harm) and 18 (MM) is designed to simulate the amplification of signals of any form, and especially multicarrier signals.

Figure 20:
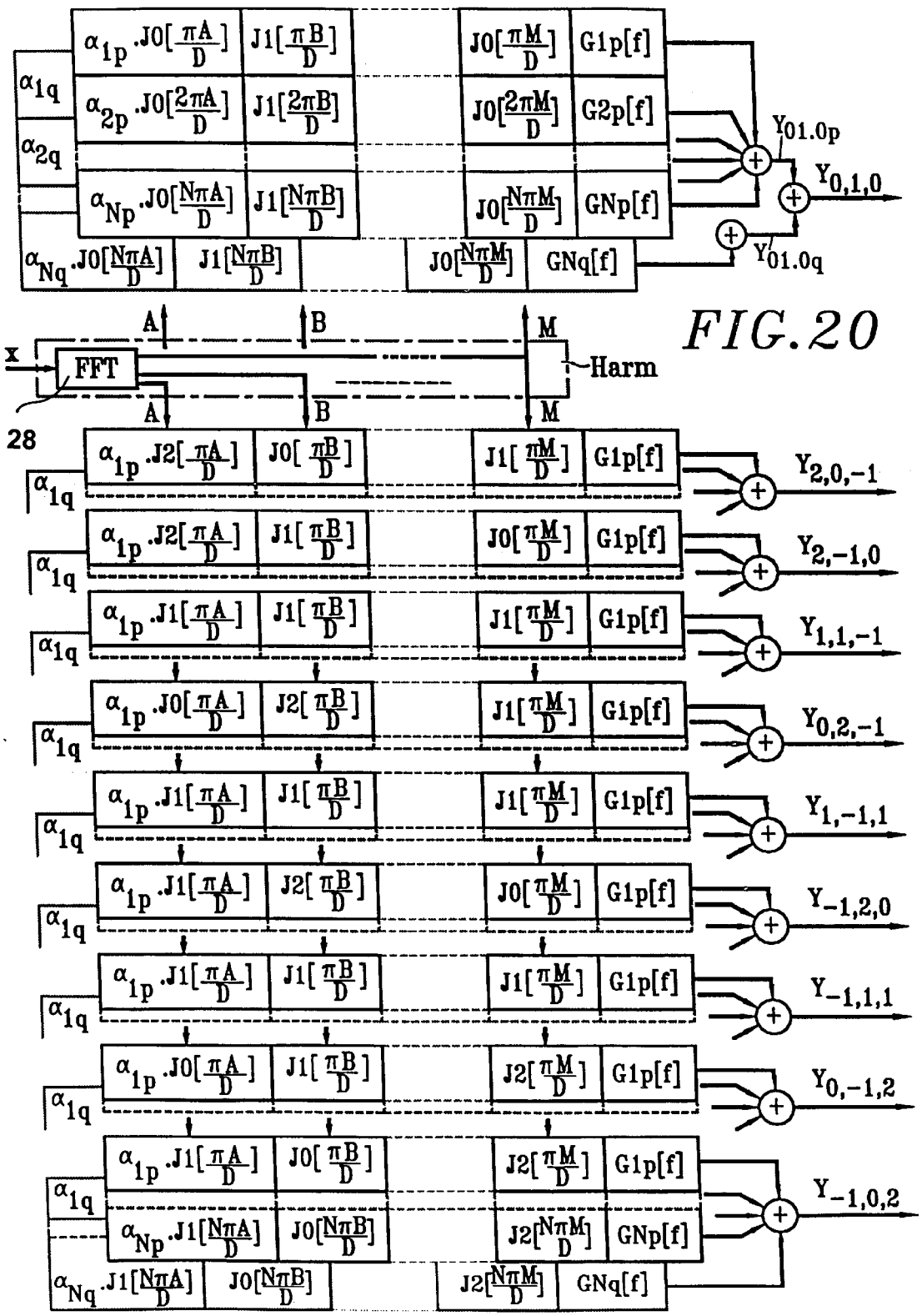
FIG. 20 illustrates a device for the simulation of nonlinear amplification with memory, including harmonics generation means according to the present invention.

As illustrated in FIG. 20, the harmonics generation block 26 (Harm) includes an FFT Fourier series analysis filter 28 to analyze the multiple-frequency input signal x into frequency components with amplitudes A, B, . . . , M. These components are applied to the input of elementary filters grouped in tables corresponding to the computation of an intermodulation component, for example $Y_{010}$. Each elementary filter has a transfer function derived from a Bessel function J, generalized on the example of the filters of FIG. 10. The detail of the transfer functions of the filter tables and of the generalized Bessel functions shall be described in detail after the description of models.

The architecture of device 10 according to the invention comprises means for the generation of harmonics, preferably with a Fourier series analysis module and a known simulation model.

A development of the formulae proposed by the most improved of the known models, the Abuelma'atti model, leads to simulation errors. These simulation errors are corrected using computation means 12. In particular, following the above equations 7' and 7", Abuelma'atti (FIGS. 10 and 23) analyzes the nonlinearity characteristics in phase P and in quadrature Q separately into a sequence of N Bessel functions according to the following formulae:

$$P = \sum_{n=1}^{N} \alpha_{np} \cdot J1(n \cdot \pi \cdot A/D) \tag{8'}$$

$$Q = \sum_{n=1}^{N} \alpha_{nq} \cdot J1(n \cdot \pi \cdot A/D) \tag{8''}$$

where 2D is the dynamic range at input of the amplifier, and $\alpha_{np}$, $\alpha_{nq}$ are coefficients computed by a minimum mean-square-error method presented in the article quoted.

This analysis and the corresponding Abuelma'atti simulation device are illustrated in FIG. 10.

The input signal x has two carriers with frequencies $f_{-1}$ and $f_1$ and equal amplitudes referenced A, i.e. that the signal x has the following form:

$$x(t)=A.\cos(2\pi.f_{-1}.t)+A.\cos(2\pi.f_1.t) \tag{9}$$

Figure 12:
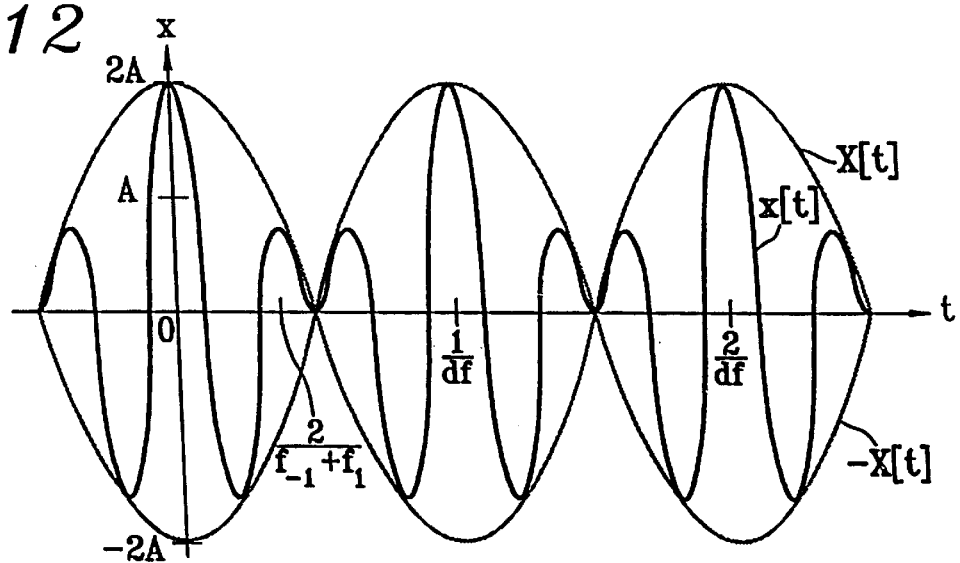
FIG. 12 illustrates the temporal progress of the two-carrier input signal x of FIG. 11 wherein the envelope x(t) and −x(t) of the two-carrier signal varies swiftly an din major proportions whereas the amplitude A of each carrier $F_1$ and $F_{-1}$ is assumed to be constant.
Figure 13:
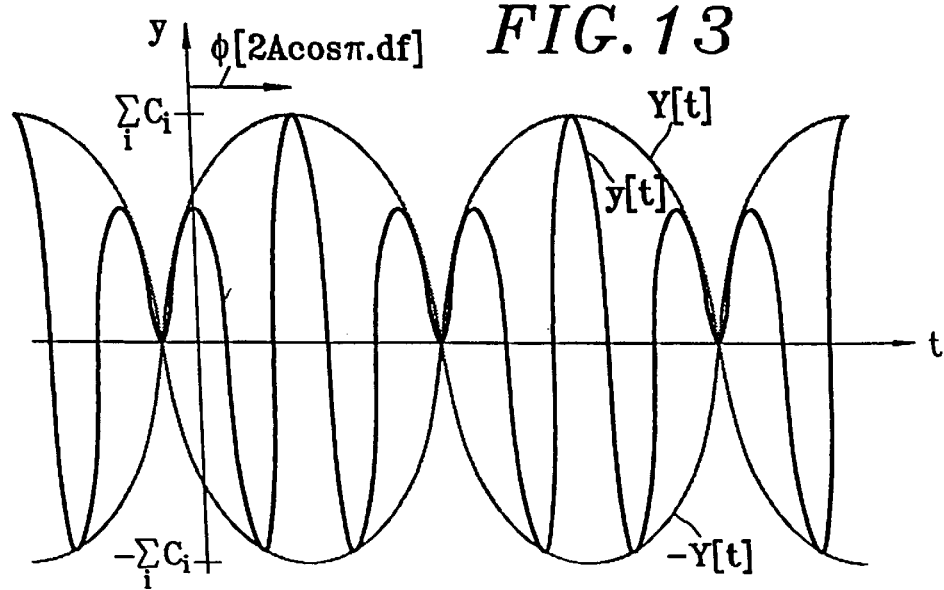
FIG. 13 illustrates the temporal progress of the output signal y corresponding to the two-carrier input signal wherein the envelope Y(t) and −Y(t) of the output signal y is deformed by the intermodulation distortions.

The input signal x then has an envelope X that is highly modulated in amplitude as is shown by FIG. 12 and the following formula:

$$X(t)=2A\cos(\pi.df.t) \tag{10}$$

where $df=f_1-f_{-1}$ represents the frequency difference between the two carriers $f_{-1}$ et $f_1$.

According to the quasi-memoryless quadratic models, the envelope Y of the output signal corresponding to the input signal x of the equations 9 and 10 takes the following quadratic form:

$$Y_p(t)=C[2A.\cos(\pi.df.t)].\cos(\Phi[2A.\cos(\pi.df.t)]) \quad (11')$$

$$Y_q(t)=C[2A.\cos(\pi.df.t)].\sin(\Phi[2A.\cos(\pi.df.t)]) \quad (11'')$$

where $Y_p$ is the in phase component of the envelope Y of the output signal y corresponding to the preceding input x, and $Y_q$ is the quadrature component of the envelope Y.

Formulae 11 and 11' cannot be applied directly because the simulation of nonlinear amplifiers ANLAM with memory for the input envelope X is sinusoidal with a frequency half the difference df and varies far too rapidly in time as compared with the time constants of memorization.

According to Abuelma'atti's improved model, the envelope Y of the output signal corresponding to the two-carrier input signal x of the equations 9 and 10 comprises a series of components with a frequency referenced $f_i$ and an amplitude referenced $C_i$, i being a positive or negative integer.

Figure 14:
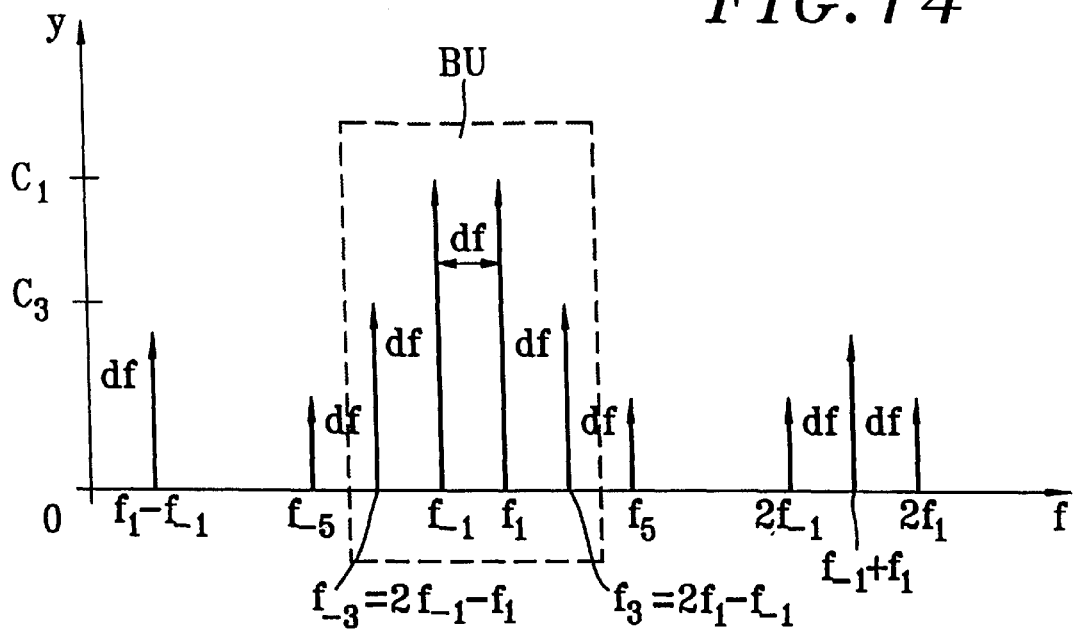
FIG. 14 illustrates the frequency of an output signal y corresponding to the amplification ANLAM with memory effect of the two-carrier input signal x of FIG. 11.
Figure 15:
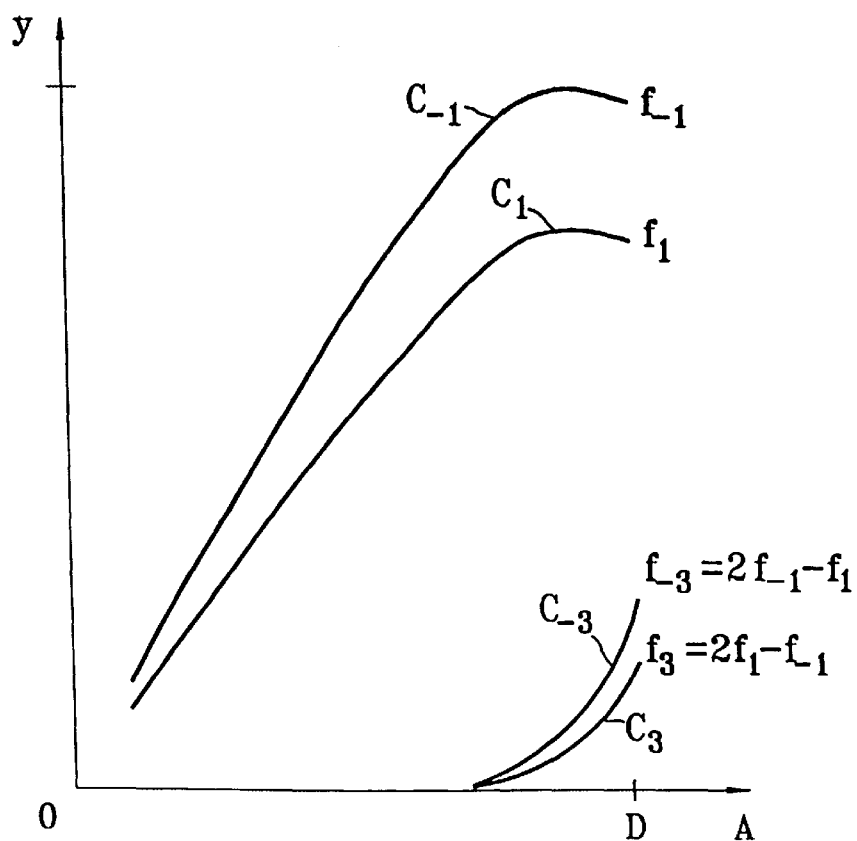
FIG. 15 illustrates the simulation of amplitudes of output frequency components of a nonlinear amplifier according to the amplitude of the carriers of a two-carrier input signal based on the M. T. Abuelma'atti model of FIG. 10.

As illustrated in FIG. 14, the frequency components of the output signal therein include the following frequencies and amplitudes:

1. A carrier component, with a frequency $f_1$ having an output amplitude $C_1$;
2. A carrier frequency, with a frequency $f_{-1}$ having an output amplitude $C_{-1}$;
3. Second-order intermodulation components with frequencies respectively equal to $2.f_{-1}$, $f_{-1}+f_1$, $2.f_1$ as well as $f_{-1}-f_1$, having non-referenced amplitudes;
4. A third-order intermodulation component with a frequency referenced $f_3$ equal to $2.f_1-f_{-1}$ and an amplitude of $C_3$;
5. A third-order intermodulation component with a frequency referenced $f_{-3}$ equal to $2.f_{-1}-f_{-1}$ and an amplitude $C_{-3}$;
6. A fifth-order intermodulation component with a frequency referenced $f_5$ equal to $3.f_1-2.f_{-1}$ and an amplitude $C_5$;
7. A fifth-order intermodulation component with a frequency referenced $f_{-5}$ equal to $3.f_{-1}-2.f_1$ and an amplitude $C_{-5}$; and
8. Other odd-order components of smaller value and other even-order components generally rejected out of the useful band BU.

Only the third-order and possibly fifth-order intermodulation components are located in the useful band BU and have amplitudes $C_{-3}$, $C_3$, $C_{-5}$, $C_5$ sufficient for examination in the response of the amplifier. The order of the intermodulation components is the sum of absolute values of the integer coefficients of combination of the carrier frequencies.

The corresponding output signal y is the sum of the amplitudes of the frequency components according to the following formula:

$$y(t)=\Sigma 2.C_i(A_i).\cos(2\pi.f_i.t) \quad (12)$$

where i takes all the negative and positive odd-order integer values, and $C_i$ is a complex amplitude that is analyzed into a real part $C_{ip}$ (in phase) and an imaginary part $C_{iq}$ (in quadrature) according to the following formula:

$$C_i(A)=C_{ip}(A)+C_{iq}(A) \quad (13)$$

Based on Abuelma'atti, the computation of the amplitudes $C_i$ of the intermodulation components coming from the amplification of a two-carrier signal are performed on the basis of a summation of Bessel functions Jn of the first kind but of various nth orders according to the following formulae:

$$C_{1p}(A) = \sum_{n=1}^{N} \alpha_{np} \cdot J0(n\cdot\pi\cdot A/D) \cdot J1(n\cdot\pi\cdot A/D) \cdot G_{np}(f_1) \quad (14')$$

$$C_{1q}(A) = \sum_{n=1}^{N} \alpha_{nq} \cdot J0(n\cdot\pi\cdot A/D) \cdot J1(n\cdot\pi\cdot A/D) \cdot G_{nq}(f_1) \quad (14'')$$

$$C_{-1p}(A) = \sum_{n=1}^{N} \alpha_{np} \cdot J1(n\cdot\pi\cdot A/D) \cdot J0(n\cdot\pi\cdot A/D) \cdot G_{np}(f_{-1}) \quad (15')$$

$$C_{-1q}(A) = \sum_{n=1}^{N} \alpha_{nq} \cdot J1(n\cdot\pi\cdot A/D) \cdot J0(n\cdot\pi\cdot A/D) \cdot G_{nq}(f_{-1}) \quad (15'')$$

$$C_{3p}(A) = \sum_{n=1}^{N} \alpha_{np} \cdot J1(n\cdot\pi\cdot A/D) \cdot J2(n\cdot\pi\cdot A/D) \cdot G_{np}(f_3) \quad (16')$$

$$C_{3q}(A) = \sum_{n=1}^{N} \alpha_{nq} \cdot J1(n\cdot\pi\cdot A/D) \cdot J2(n\cdot\pi\cdot A/D) \cdot G_{nq}(f_3) \quad (16'')$$

$$C_{-3p}(A) = \sum_{n=1}^{N} \alpha_{np} \cdot J2(n\cdot\pi\cdot A/D) \cdot J1(n\cdot\pi\cdot A/D) \cdot G_{np}(f_{-3}) \quad (17')$$

$$C_{-3q}(A) = \sum_{n=1}^{N} \alpha_{nq} \cdot J2(n\cdot\pi\cdot A/D) \cdot J1(n\cdot\pi\cdot A/D) \cdot G_{nq}(f_{-3}) \quad (17'')$$

where $\alpha_{np}$, $\alpha_{nq}$ are the coefficients obtained from the equations 8' and 8'', by developing the characteristics P and Q of nonlinearity in first-order Bessel functions J1 only, and J0, J1, J2 are the first kind of zero order, first order and second order Bessel functions respectively.

The zero order, first order, second order or Nth order of a Bessel function J0, J1, J2 or JN is chosen so as to correspond to the absolute value of the integer coefficient of combination of a carrier frequency $f_{-1}$ or $f_1$ in the frequency $f_i$ of the intermodulation component with an amplitude $C_i$. The $|i|$ order of each intermodulation component $C_i$ therefore corresponds to the sum of the zero, first, second, or Nth order of the Bessel functions J0, J1, J2 or JN involved in each formula.

In the general case where the input signal x has m frequency components (carriers) of any amplitude, referenced A, B, . . . , M, there is obtained a multitude of intermodulation products each having a frequency given by the following formula:

$$f_i=\alpha.f_A+\beta.f_B+ \ldots +\mu.f_M$$

where $\alpha$, $\beta$, . . . , $\mu$ are relative integers, and $f_A$, $f_B$, . . . , $f_M$ are the frequencies of the carriers A, B, . . . , M respectively present in the input signal x.

The amplitude $C_i$ of each intermodulation component with a frequency $f_i$ follows the following general formulae:

$$C_{ip}(A, B, \ldots, M) = \sum_{n=1}^{N} \alpha_{np} \cdot J|\alpha|(n \cdot \pi \cdot A/D) \cdot J|\beta|(n \cdot \pi \cdot B/D) \cdot J|\mu|(n \cdot \pi \cdot M/D)$$

$$C_{iq}(A, B, \ldots, M) = \sum_{n=1}^{N} \alpha_{nq} \cdot J|\alpha|(n \cdot \pi \cdot A/D) \cdot J|\beta|(n \cdot \pi \cdot B/D) \cdot J|\mu|(n \cdot \pi \cdot M/D)$$

where $J|n|$ is a Bessel function of the first kind and of an order corresponding to the absolute value of n (generalization).

FIG. 20 illustrates a sophisticated embodiment of means MM for the computation of intermodulation components that has been developed from these formulae of a model with memory. In particular, FIG. 20 is a schematic view in the form of tables of elementary filters connected in series horizontally to compute the product of the generalized Bessel functions $J|\alpha|$ modulated by the amplitude of the components A, B, ..., M of the multicarrier signal. Each horizontal result is then added up with the other horizontal results of the table and with the results of a similar table for the components in quadrature before giving, at output, the amplitude of a harmonic $Y\alpha,\beta, \ldots, \mu$.

In this sophisticated exemplary embodiment, on the basis of a central carrier B and two side carriers A and M, apart from the amplified carrier $Y_{010}$ with a frequency $f_B$, there are at least nine intermodulation products $Y_{20-1}$, $Y_{2-10}$, $Y_{11-1}$, $Y_{02-1}$, $Y_{1-11}$, $Y_{-120}$, $Y_{-111}$, $Y_{0-12}$ et $Y_{-102}$ in the immediate vicinity of the central frequency $f_B$.

Therefore, the number of intermodulation products increases exponentially with the number m of carriers, so that the performance of a simulation for a signal with more than two carriers cannot be detailed in the present application. Those skilled in the art can generalize the computations described for two carriers.

A decisive factor of quality in the designing and choice of a microwave amplification system is the ratio of the amplitude $C_3$ of the greatest intermodulation component at output to the amplitude $C_1$ at output of a carrier component.

In the preferred embodiment of the present application, this factor is an intermodulation rejection factor that is expressed by the following formula:

$$P/I = C1/C3 \tag{18}$$

The greater the ratio P/I, the higher is the quality of this system, with the carrier C1 being distinguished more clearly from the intermodulation noise represented by C3.

In the microwave domain, the rejection factor is generally expressed in terms of power. This corresponds to the following ratio:

$C1^2/C3^2$ referenced herein $P/I^2$.

In quadratic form, the intermodulation rejection factor can be written as follows:

$$P/I^2 = \frac{(C_{1p}^2 + C_{1q}^2)}{(C_{3p}^2 + C_{3q}^2)} \tag{19}$$

By using the above results of the equations 14', 14" and 16', 16" established by Abuelma'atti, the intermodulation rejection factor simulated for a microwave amplifier varies very little according to the frequency.

Indeed, the frequency correctors $G_n(f_i)$ have a low correction effect, the curve of the correctors $G_n$ being computed from measurements with a single carrier, hence without modulation of the input envelope. In particular, the intermodulation rejection factors P/I thus computed are not a function of the frequency difference df of the carriers contrary to the effects of resonance observed and illustrated for example in FIG. 16.

According to a first embodiment of the invention, the characteristics of intermodulation rejection are precisely measured and these measurements are used to correct the output signal y computed on the basis of a known model.

In particular, the signal y(t) computed according to the Abuelma'atti model is compared with a signal z(t) comprising intermodulation components as really measured. This comparison results in modulation signal u(t) which will be simulated by a modulation filter 30 according to the invention.

FIG. 21 illustrates a schematic view of a first embodiment of device 10 according to the invention, including modulation filter 30. Filter 30 has a transfer function E(f,H) that computes the signal u as a function of the input signal. The signal y of the known model is then corrected by the modulator signal u in a Mix block 32 to produce a signal z which reproduces the modulation distortions actually measured.

It is necessary to establish certain relationships that can be used to construct the transfer function E(f,H) of filter IMF 30 for the computation of the intermodulations. In this regard, the modulator signal u is useful only if the input signal has an amplitude-modulated envelope X. Indeed, when the input signal x is not modulated, the known model has an output signal y that appropriately simulates the response of the amplifier.

In the preferred embodiment of the present invention, the envelope of the signal is computed by device 10 by taking the square of the norm of the signal x. Taking into account equation 10 of the envelope X of the two-carrier signal with an amplitude A and a frequency difference df, the square $X^2$ of the following envelope is obtained:

$$X^2(t) = 4.A^2.\cos^2(\pi.df.t) \tag{20}$$

The square $X^2$ given by equation 20 is split up into a constant amplitude $A^2$ and a modulation factor given by the following equation:

$$X^2(t) = 2.A2. + 2.A^2.\cos(2\pi.df.t) \tag{20'}$$

FIG. 21 illustrates that filter 30 receives, at input, the r.m.s. value $X^2(t)$ of the envelope of the input signal x.

According to the invention, the modulator signal u generated by filter 30 enables the writing of a correction formula as follows:

$$Z(t) = Y(t).[1 + U(t)] \tag{21}$$

where

Z is the envelope of the output signal z with the actually measured intermodulations, Y is the envelope of the signal y computed by a known model; and U is the envelope of the signal u.

As a result, when there is no modulation at input, the signal z simulated according to the invention has an envelope Z that corresponds to the envelope Y of the output signal y simulated by the known model MNLSM 14, 16 or MM 18, and the modulator signal u is advantageously zero.

By assumption, the envelope U of the modulator signal is expressed similarly to the equation 20' as the result of the conversion of the r.m.s. value $X^2$ by the transfer function E(f,H) which depends on the frequency f and the amplitude H of the harmonics h at input, namely in the following form:

$$U(t)=2A^2.E(0,A)+2A^2.E(df,A).\cos(2\pi.df.t) \quad (22)$$

where

E(df,A) is the response of the transfer function to a signal with a frequency df and an amplitude A, and E(0,A) is the response of the transfer function with a zero frequency difference.

Conventionally, E(0,A) has a zero value since it is unnecessary to have a modulator signal u when there is no difference in carrier frequency.

K is used as a reference for the following variable:

$$K=A^2.E(df,A)$$

The envelope U of the modulator signal given by the equation 22 is expressed in the following complex and exponential form:

$$1+U(t)=K.\exp(-j.2\pi df.t)+1+K.\exp(j.2\pi.df.t) \quad (23)$$

In a manner similar to the equation (12), the envelope Y of the output signal y of the known model is expressed in the following complex and exponential form:

$$Y(t) = \sum_i C_i(A) \cdot \exp(j \cdot i \cdot \pi \cdot df \cdot t) \quad (24)$$

where i is an odd integer taking all the negative and positive values.

$$\begin{aligned} Y(t) = &+C_{-5} \cdot \exp(-j \cdot 5\pi \cdot df \cdot t) + C_{-3} \cdot \exp(-j \cdot 3\pi \cdot df \cdot t) + \\ & C_{-1} \cdot \exp(-j \cdot \pi \cdot df \cdot t) + C_1 \cdot \exp(j \cdot \pi \cdot df \cdot t) + \\ & C_3 \cdot \exp(j \cdot 3\pi \cdot df \cdot t) + C_5 \cdot \exp(j \cdot 5\pi \cdot df \cdot t) + \ldots \end{aligned} \quad (24')$$

Hence, from the equations (21), (23) and (24'), Z(t) is expressed as follows:

$$\begin{aligned} Z(t) = &+(K \cdot C_{-5} + C_{-3} + K \cdot C_{-1}) \cdot \exp(-j \cdot 3\pi \cdot df \cdot t) + \\ & (K \cdot C_{-3} + C_{-1} + K \cdot C_1) \cdot \exp(-j \cdot \pi \cdot df \cdot t) + \\ & (K \cdot C_{-1} + C_1 + K \cdot C_3) \cdot \exp(j \cdot \pi \cdot df \cdot t) + \\ & (K \cdot C_1 + C_3 + K \cdot C_5) \cdot \exp(j \cdot 3\pi \cdot df \cdot t) + \ldots \end{aligned} \quad (25)$$

FIRST ALTERNATIVE EMBODIMENT OF THE INVENTION

In the first alternative method of the invention, only the amplitude of the third-order intermodulation components is modulated by carrying out the minimum modification of the first-order carrier components computed by the known model. This is obtained by minimizing the value of K so that the terms $K.C_{-3}$, $K.C_1$, $K.C_{-1}$ and $K.C_3$ are negligible. In this case, the two central lines of the equation (25) indicate that the carrier components with a frequency $f_{-1}$ and $f_1$ truly have an amplitude substantially equal to $C_{-1}$ and $C_1$, respectively in the modulated output signal z.

In a first stage, it may be assumed that the amplitudes $C_i$ of intermodulation components do not depend on the frequency $f_i$, by eliminating the frequency corrections $G_{np,q}(f_i)$ provided for in the computation formulae 12' to 15" . The computation is then simplified for the components that are symmetrical in frequency $f_{-i}$ and $f_i$ around the carriers $f_{-1}$ and $f_1$ have equal amplitudes according to the following identity:

$$C_{-i}=C_i$$

The last two lines of the equation (23) represent the frequency components $f_1$ and $f_3$ respectively, enabling the computation of the rejection factor P/I which finally has the following value:

$$P/I = \frac{|C_1 + K \cdot (C_1 + C_3)|}{|C_3 + K \cdot (C_1 + C_5)|} \quad (26)$$

In operation, after having determined the amplitudes $C_1(A)$, $C_3(A)$ and $C_5(A)$ of the components according to the known methods and after having measured the value of the rejection factor P/I for this value with an amplitude A of the carriers, the equation (26) is resolved to determine the value of the variable K.

For the resolution, the variable K is preferably in the following complex form:

$$K=|K|.\exp(j.\theta)$$

The argument $\theta$ is made to vary in order to compute the values of the norm $|K|$ as a function of the argument $\theta$.

The minimization sought here above of the modification of amplitude $C_{-1}$ and $C_1$ of the carriers $f_{-1}$ and $f_1$ is obtained by using the argument $\theta$ enabling the minimum value of the norm $|K|$ to be obtained.

FIG. 18 illustrates a schematic view of the system of measurements performed according to the invention. The characteristics are determined by taking a series of measurements with a multicarrier signal $f_{-1}$ and $f_1$, in obtaining a variation of both amplitude A, A', A" of the carriers as well as the frequency difference $df=f_1-f_{-1}$ of the carriers. Furthermore, it is possible to obtain a variation in the basic frequency f of the carrier $f_1$ or $f_{-1}$ used as a reference for the frequency difference df.

Figure 16:
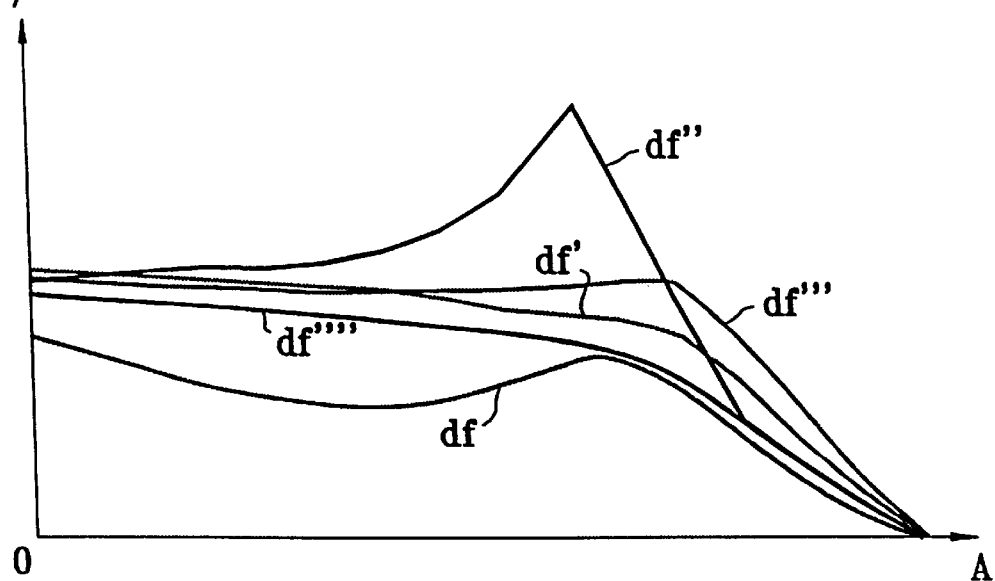
FIG. 16 illustrates measurements of rejection of intermodulation components at output in relation to carrier components at input of a nonlinear amplifier with memory expressed in the form of a ratio C1/C3 corresponding to a ratio between carrier output amplitude and intermodulation component amplitude as a function of the amplitude A at input of the carriers, for various frequency differences df of the carriers, the measurements being implemented according to the present invention.

For each frequency difference df, as shown in FIG. 16, a characteristic curve P/I is measured as a function of the amplitude A or the power of the input carrier. By applying the above computation for each frequency difference df, a curve of the values of the variable K is obtained as a function of the amplitude A of the carriers. By calculating this variation in the frequency differences df, df', df", df''', d"" of the carriers, there is thus obtained a table of curves of values of the variable K. This table of values of the variables K establishes the frame of the transfer function E(df,H) of filter 30.

The continuity of the transfer function E(df,H) according to the amplitude H of the harmonics h at input or according to the power $X^2$ of the envelope of an input signal x is obtained by interpolating the discrete values of the table of the values of the variable K.

The operations of computation and interpolation are performed also for all the frequency difference values df, the values of the variable K possibly being also interpolated between the chosen values df', df", df''', df"" with a frequency difference df. Computation means 12 preferably performs these computations and stores the values of the variable K in matrix form.

At a second stage, it is assumed that the amplitudes $C_i$ of the intermodulation components depend on the frequency $f_i$ according to the complete formulae of the equations 14' to 17". There is then no longer any identity between $C_i$ and $C_{-i}$.

The dissymmetries in frequency of the response of the amplifier are then simulated by this variant of the first alternative method. In this case, the transfer function E'(df, H) of the filter 14 may be dissymmetrical.

The hypotheses of the equation 22 and of the preceding computation are then modified according to the following complex formula:

$$U'(t) = A^2 \cdot E'(-df, A) \cdot \exp(-j \cdot 2\pi \cdot df \cdot t) + 2A^2 \cdot E'(O, A) + \quad (27)$$
$$A^2 \cdot E'(df, A) \cdot \exp(j \cdot 2\pi \cdot df \cdot t)$$

where

E'(O,A) has a zero value for the filter does not transfer any signal continuous component, and E'(-df,A) is a response of the transfer function E' to a frequency difference -df, which is the response distinct from the response E'(df,A) to a frequency difference df, owing to the dissymmetry of the filter E'.

The terms of the equation 22' are simplified as follows:

$$K^+ = A^2 \cdot E'(df, A)$$

and $$K^- = A^2 \cdot E'(-df, A)$$

The equation 23 is then modified according to the following formula:

$$1 + U'(t) = K^- \cdot \exp(-j \cdot 2\pi \cdot df \cdot t) + 1 + K^+ \cdot \exp(j \cdot 2\pi \cdot df \cdot t) \quad (28)$$

Let $C_i'$ denote the modulated components of the output signal z' obtained according to this variant of the first alternative method. The output signal z' is then obtained by modulating in Mix block the signal y of a known model by a modulator signal u' computed by the transfer function E' of filter 36 of FIG. 23. This makes it possible to distinguish the modulated components $C_i'$ according to the invention from the components $C_i$ computed by the known memoryless model MNLSM.

According to the above equations 21, 24' and 28, the modulated components have amplitudes $C_{-3}'$, $C_{-1}'$, $C_1'$, $C_3'$ determined by the following formulae:

$$C_1' = K^+ \cdot C_{-1} + C_1 + K^- \cdot C_3 \quad (29)$$

$$C_3' = K^+ \cdot C_1 + C_3 + K^- \cdot C_5 \quad (30)$$

$$C_{-1}' = K^+ \cdot C_{-3} + C_{-1} + K^- \cdot C_1 \quad (31)$$

$$C_{-3}' = K^+ \cdot C_{-5} + C_{-3} + K^- \cdot C_{-1} \quad (32)$$

Two more complex results of intermodulation rejection factors, referenced $P/I^+$ and $P/I^-$, are obtained depending on whether the rejection factor is measured on the higher carrier and intermodulation frequencies $f_1$ and $f_3$ or on the lower carrier and internodulation frequencies $f_{-1}$ and $f_{-3}$. The two rejection factors have the following shapes:

$$P/I^+ = |C_1'/C_3'| = \frac{|K^+ \cdot C_{-1} + C_1 + K^- \cdot C_3|}{|K^+ \cdot C_1 + C_3 + K^- \cdot C_5|} \quad (33)$$

$$P/I^- = |C_{-1}'/C_{-3}'| = \frac{|K^+ \cdot C_{-3} + C_{-1} + K^- \cdot C_1|}{|K^+ \cdot C_{-5} + C_{-3} + K^- \cdot C_{-1}|} \quad (34)$$

In a known way, the two equation system 33 and 34 are resolved with two variables $K^-$ and $K^+$.

Thus, when the amplifier has a dissymmetrical response around carrier frequencies, the intermodulation rejection characteristics are measured by providing for the measurement of the two upper and lower rejection factors $P/I^+$ and $P/I^-$ for each amplitude A and frequency difference df of carriers, in order to simulate the modulation distortions at output.

SECOND ALTERNATIVE EMBODIMENT OF THE INVENTION

A second alternative method according to the invention is used to simulate the second effect of intermodulation distortion.

Figure 17:
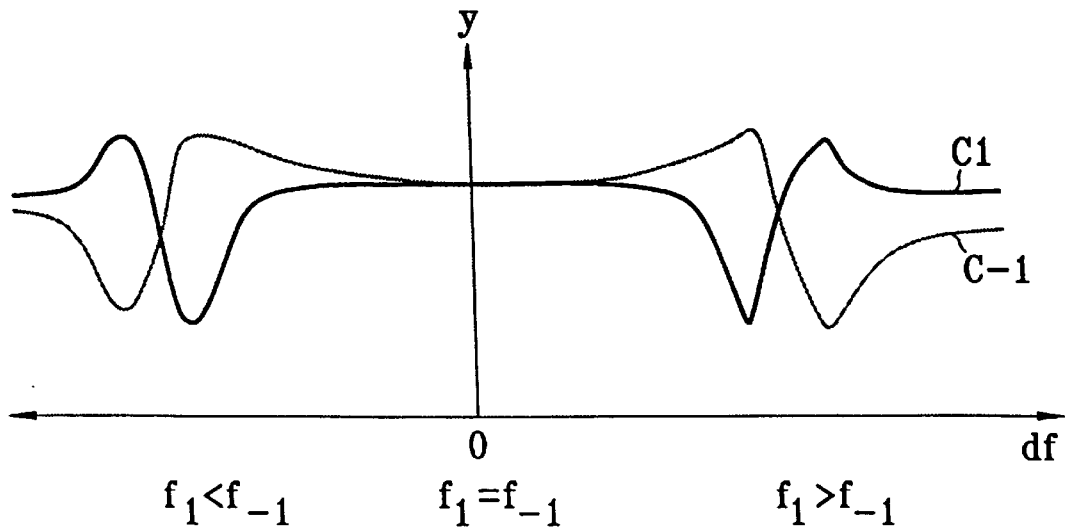
FIG. 17 illustrates measurements of interaction of output carriers of a nonlinear amplifier with memory, in the form of an output amplitude y of a carrier as a function of the frequency difference of the carriers, the measurements being implemented according to the present invention.

The second effect observed is the variation of the gain of the carriers as a function of the envelope frequency df/2 illustrated for example in FIG. 17. By measuring the gain of the amplifier for a carrier $f_1$ with an output amplitude $C_1$ in the presence of another carrier $f_{-1}$, it is realized that the gain may have major variations as a function of the frequency difference df of the two carriers $f_{-1}$ and $f_1$.

Computation means 14 allows adjustment of the output amplitudes $C_1$ and $C_{-1}$ of the carriers computed by a known model in taking account of measurements of characteristics C1/C-1 of interaction of carriers.

Preferably, the adjustment of the second alternative method is combined with the adjustment of the main intermodulation components C3 and C-3 planned in the first alternative method of the invention explained here above. It is possible to furthermore provide for an adjustment of the secondary intermodulation components C5, C-5.

In the second embodiment of a device according to the invention, the adjustment is done by correcting the output signal y or preferably the modulated signal z or z' by means of a correction signal v coming from a filter 38 having a correction transfer function F that is summed with z' in a block 40.

The transfer function F is computed similarly to the function E by assuming a correction of the modulated components $C_i'$ formulated here above in the equations 29 to 32 according to the following formulae:

$$C_3'' = K^+ \cdot C_1 + C_3 + K^- \cdot C_5 \quad (35)$$

$$C_{-3}'' = K^+ \cdot C_{-5} + C_{-3} + K^- \cdot C_{-1} \quad (36)$$

$$C_1'' = K^+ \cdot C_{-1} + C_1 + K^- \cdot C_3 + L^+ \quad (37)$$

$$C_{-1}'' = K^+ \cdot C_{-3} + C_{-1} + K^- \cdot C_1 + L^- \quad (38)$$

wherein $$L^+ = A \cdot F(df, A)$$

$$L^- = A \cdot F(df, A)$$

F being the correction function transfer expressed as a function of the modulation frequency of the envelope, namely the frequency difference df of the amplitude carriers A at input.

The components $C_3''$, $C_{-3}''$, $C_1''$ and $C_{-1}''$ are called corrected components.

The equations 35 to 38 form a system of four equations with four variables $K^+$, $K^-$, $L^+$, $L^-$ that is resolved in a known manner. The resolution of the last two equations 37 and 38 give the values of the correction variables $L^+$ and $L^-$.

The precise measurement of the real amplitudes of the third-order intermodulation components $f_3$, $f_{-3}$ and of the carriers $f_1$, $f_{-1}$ thus make it possible, after computation of the first order, third order and fifth order components $C_{-5}$, $C_{-3}$, $C_{-1}$, $C_1$, $C_3$, $C_5$ according to a known model, to compute the modulation transfer function E(df,A) and frequency correction function F(df,A).

Full measurements of amplitudes of components at output of an amplifier of this kind comprising both measurements of third-order and fifth-order intermodulation component rejection at output and measurements of carrier interaction thus enable the total simulation of the signal response with the distortions due to the envelope memory effect of a nonlinear memory amplifier. It will be noted however that partial measurement such as the third-order intermodulation rejection measurements C1/C3 or the carrier interaction measurements C1/C–1 are enough to characterize certain effects of intermodulation distortion.

A second alternative method makes it possible to validate the model by the measurement of the signal-to-noise ratio in the presence of a large number of carriers whose power spectral density DSP is modeled by a white noise.

FIGS. 19A and 19B illustrate a noise frequency graph respectively applied at input and measured at output of a nonlinear memory amplifier in order to characterize it.

According to the invention, as shown in FIG. 19A, there is applied a white noise having a power spectral density DSP with a level NP that is constant in a frequency band BW except in a frequency window BH where the noise is absent. This input signal although it has a constant spectral density has a variable amplitude. It therefore enables a measurement of the distortions of modulation appearing at output of the amplifier. The distortions appear at output of the amplifier in the form of a carryover of noise to the above-defined window BH.

The characterization of the amplifier consists in measuring its capacity to limit the noise carryover into the window BH by measuring the difference in noise level NPR at output in the frequency band BW and in the window BH.

These measurements of characteristics are performed at different noise levels NP and introduced into the simulator so that it reproduces its noise characteristics according to the conditions of operation.

A third mode of control of the validity of the model consists in measuring the binary error rate during an amplification of modulated carriers.

OPERATION OF PREFERRED EMBODIMENT OF INVENTION

FIG. 24 illustrates device 10, according to the invention, to make measurements of characteristics of a nonlinear amplifier DUT with memory effect. The operation of test bench device 10 is within the scope of those skilled in the art. Device 10 includes a Calc. block 42, a signal unit 44, a noise unit 46, and an error rate unit 48. Device 10 further includes known structures such as a Band. Transp. block 50, gates 52, 54, 56, an Att. unit 58, an Amp. unit 60, a DUT unit 62, a SIM unit 64 and a NA unit 66.

In particular, unit 10 is configured for the generation of amplitude modulated signals with, for example, two generators SG1 and SG2 having frequencies that may be distinct to apply a multicarrier signal to amplifier device DUT unit 62 to be characterized. It furthermore comprises noise measurement unit 46 with white noise generator NG with a window and possibly unit 48 to measure the binary error rate with a generator MOD of signals modulated by a random binary message and a comparator Comp to compare the original signal and the return signal from the amplifier.

FIG. 25 illustrates a drawing of the files of characteristics implemented by computational means 12 to simulate the nonlinear amplification according to the method of the invention.

A computational program 68 receives input from a file 70 that includes the results of measurements of static characteristics AP, namely curves C,Φ or curves P,Q drawn up with constant amplitude (in a known way).

Program 68 further receives input from a series of files 72 that include the results of measurements of dynamic characteristics P/I such as intermodulation rejection curves C1/C3 or carrier interaction curves C1/C–1. Each file 72 corresponds to, for example, a frequency difference df of carriers. Program 68 is launched after the input of data is read from a general data Dat file 74 into the amplifier to be simulated.

After program 68 processes files 70, 72 and 74, program 68 calculates and produces a file 76 of the coefficients a of sequences of direct transfer functions, especially Bessel functions. Program 68 further calculates and produces a file 78 and a file 80 that contain the data of the above-mentioned modulation transfer function E and correction function F, respectively.

Figure 26:
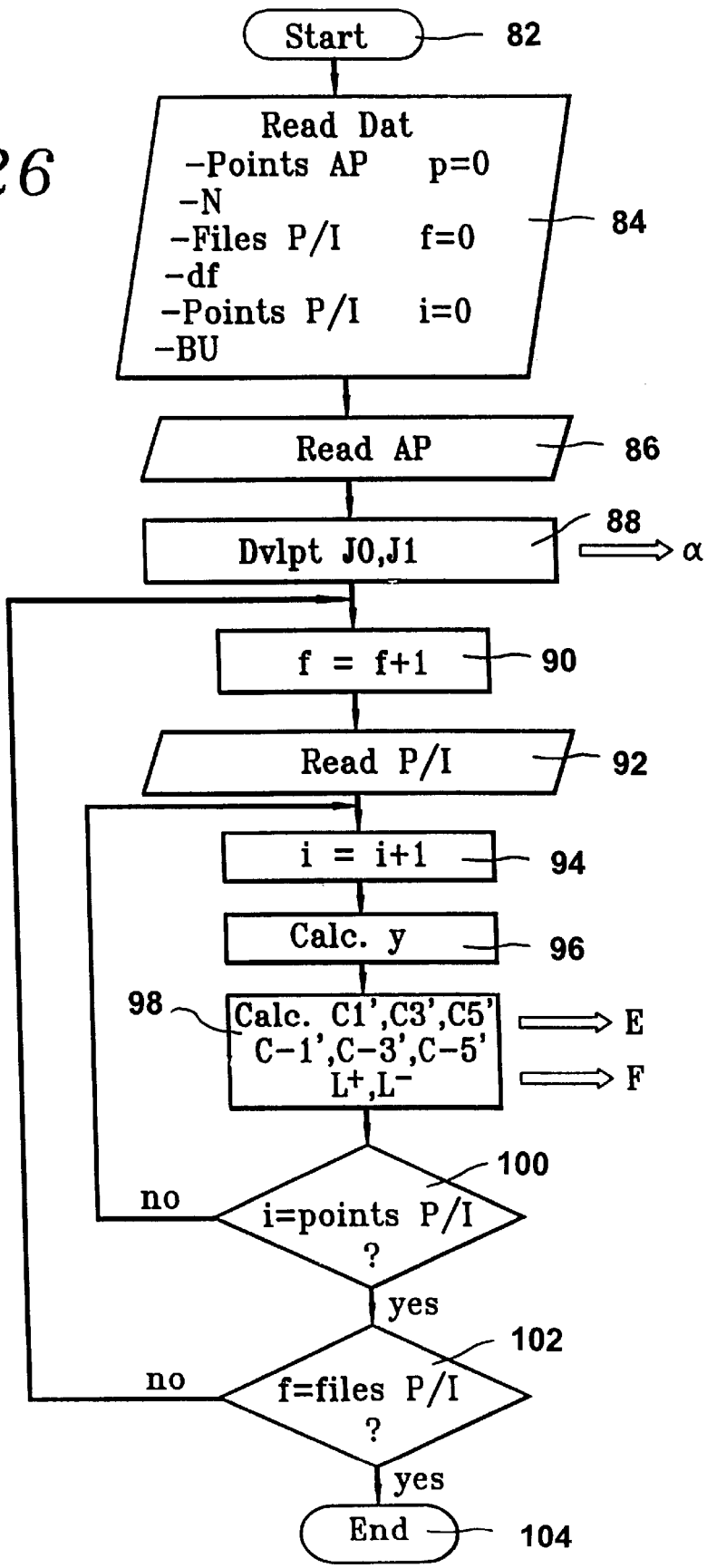
FIG. 26 illustrates a diagram of steps for the simulation of responses of a nonlinear amplifier according to the present invention.

FIG. 26 illustrates an exemplary drawing of a flow diagram of the process steps implemented by program 68 including a start block 82, a read dat block 84, a read AP block 86, a dvlpt block 88, an increment block 90, a read P/I block 92, an increment block 94, a calc block 96, a calc block 98, an assignment block 100, an assignment block 102, and an end block 104.

After reading data and initializing p, f and i, dvlpt block 88 calculates a as an output. After incrementing f in block 90, reading P/I in block 92, incrementing i in block 94 and calculating y in block 96, calc block 98 calculates values for E and F as outputs. If i then equals points P/I, the condition f=files P/I is tested in block 102. If the result of block 102 is positive, then the loop is ended at block 104, otherwise the process proceeds to block 90 and f is incremented. If i does not equal points P/I, then the process proceeds to block 94 and I is incremented.

Other exemplary embodiments, characteristics and advantages may be developed by those skilled in the art without going beyond the scope of the invention, defined especially by the following claims.

What is claimed is:

1. A method for the simulation of signal responses of a nonlinear amplifier showing an envelope memory effect, the method comprising the steps of:

measuring a set of conversion characteristics of the nonlinear amplifier with amplitude/amplitude conversion and amplitude/phase-shift conversion, wherein each measurement includes a constant amplitude input signal comprising a single frequency component and each of the conversion characteristics is measured at a plurality of frequency values and/or at a plurality of amplitude values of monofrequency input signals;

developing the conversion characteristics in direct transfer functions establishing an amplitude and an output phase-shift of an output signal frequency component according to an amplitude of an input signal frequency component;

measuring characteristics of modulation distortions of the nonlinear amplifier by applying an input signal comprising at least two frequency components, wherein the modulation distortion characteristics are measured at a plurality of frequency values and/or at a plurality of amplitude values corresponding to the at least two frequency components, and wherein each measurement establishes the respective amplitudes of the corresponding frequency components of the output signal as a function of the frequency difference and the amplitude values of the input signal; and processing the modulation distortion characteristics to calculate at least one modulation transfer function correcting the amplitude of the frequency components of the output signal established by the direct transfer function when the amplitude of the input signal is modulated, wherein the modulation transfer function correction depends on the frequency differences and the amplitude values of the frequency components of the input signal in order to simulate the envelope memory effect.

2. A method according to claim 1, further comprising the steps of:

measuring the characteristics at different frequencies; and computing frequency correctors for the direct transfer functions.

3. A method according to claim 1, comprising steps consisting in:

measuring characteristics of rejection of a set of intermodulation components appearing at an output of the nonlinear amplifier at frequencies different from the input signal frequency components, wherein each measurement includes the amplitude of the intermodulation components as a function of the frequency difference and of the amplitude of the input signal frequency components; and computing from the measurements of characteristics of rejection of the set of intermodulation components a modulation transfer function establishing a modulator signal modulating the amplitude of the output signal frequency components of the direct transfer functions based on the frequency differences and the amplitudes of the input signal frequency components.

4. A method according to claim 3, further comprising the steps of:

measuring two factors of rejection of intermodulation components for each frequency difference and each amplitude of the input frequency components, wherein the amplifier is dissymmetrical in frequency; and computing a dissymetrical modulation transfer function having a response to a negative frequency difference that is distinct from a response to a positive frequency difference.

5. A method according to claim 1, further comprising the steps of:

measuring characteristics of interaction of frequency components by applying a signal comprising at least two frequency components to the input of the nonlinear amplifier, each measurement giving the output amplitude of said frequency components as a function of the frequency difference and of the input amplitude of said frequency components; and computing, from the measurements of characteristics of interaction of frequency components, a correction transfer function setting up a correction signal adjusting the amplitude or the modulated amplitude of frequency components coming from the direct transfer functions, based on the frequency differences and the amplitudes of the input frequency components.

6. A method according to claim 5, further comprising the step of:

measuring characteristics of gain in amplitude for a carrier in the presence of another carrier as a function of the frequency difference of the carriers, wherein the amplifier includes variation in gain of carriers as a function of the envelope frequency.

7. A method according to claim 1, further comprising the step of:

measuring noise characteristics of modulation at output, each measurement being performed with determined amplitudes of input modulation.

8. A method according to claim 1, further comprising the step of:

measuring characteristics of noise carryover in a frequency window, each measurement being performed with an input of white noise with a window.

9. A method according to claim 1, wherein a signal response of a microwave amplifier working at high efficiency is simulated.

10. A device for the simulation of signal responses of a nonlinear amplifier having a memory effect, the device comprising:

at least one direct filter having a transfer function prepared from characteristics of amplitude/amplitude and amplitude/phase shift conversion on the nonlinear amplifier, wherein each conversion measurement includes a constant amplitude input signal having a single frequency component;

means for the generating harmonics in response to an input signal having a plurality of frequency components;

at least one modulation filter for modulating an output signal corresponding to the direct filter, wherein the modulation filter includes a transfer function prepared from characteristics of modulation distortions in amplitude measured on the nonlinear amplifier, and wherein each modulation distortion measurement includes a modulated amplitude input signal comprising a plurality of frequency components.

11. A device according to claim 10, wherein the module further comprises:

at least one frequency corrector weighting the transfer function of a direct filter, each corrector having a correction function based on conversion characteristics measured on the amplifier at different single-carrier signal frequencies.

12. A device according to claim 10, wherein the harmonics generation means comprise a module for the Fourier analysis of a signal into frequency components.

13. A device according to claim 10, wherein the harmonics generation means comprise a combinational module computing the combinations of frequencies of intermodulation components.

14. A device according to claim 10, wherein the harmonics generation means comprise a normative module computing an r.m.s. value of signal amplitude.

15. A device according to claim 10, wherein the modulation filter has a transfer function based on characteristics of rejection of intermodulation components wherein the amplitude intermodulation components computed by the modulation filter are added to the response of the computation module when the amplification of a multicarrier signal is simulated by the device.

16. A device according to claim 10, further comprising:

a filter for the correction of the response of the computation module, the filter having a transfer function prepared from interaction characteristics of carriers, wherein the amplitude of a carrier given by the computation module is corrected by the correction filter when the amplification of a multicarrier signal is simulated by the device.

17. A device according to claim 10, wherein a signal response of a microwave amplifier working at high efficiency is simulated.

18. A device for the simulation of signal responses of a nonlinear amplifier having a memory effect, the device comprising:

at least one direct filter establishing an amplitude and/or phase of each corresponding frequency component of an output signal corresponding to a nonlinear amplifier response to an input signal comprising a frequency component, wherein the at least one direct filter includes a direct transfer function computed from a plurality of conversion characteristics of amplitude/amplitude and amplitude/phase-shift conversion measured on the nonlinear amplifier, and wherein each conversion measurement involves a constant amplitude input signal comprising a single frequency component, and the conversion characteristics are measured at a plurality of frequency values and/or at a plurality of amplitude values of single frequency input signals;

means for generating intermodulation components corresponding to harmonic interactions between the frequency component of the input signal;

at least one modulator filter for modulating amplitude of the intermodulation components and/or the amplitude of the frequency components of the output signal established by the direct filter when the input signal comprises a plurality of frequency components;

wherein the modulation of the modulator filter depends on the frequency differences or a plurality of frequency values, and the amplitude values of the plurality of frequency components of the input signal;

wherein the modulator filter includes a modulation transfer function computed from modulation distortion characteristics measured on the nonlinear amplifier, each modulation distortion measurement including a modulated amplitude input signal comprising a plurality of frequency components and establishing each amplitude value of a plurality of frequency components of an output signal corresponding to the nonlinear amplifier response to the multifrequency input signal; and wherein the modulation distortion characteristics are measured at a plurality of frequency values and/or a plurality of amplitude values of the plurality of frequency components of the multifrequency input signal.

* * * * *